(12) United States Patent
Yamazaki et al.

(10) Patent No.: US 6,225,218 B1
(45) Date of Patent: *May 1, 2001

(54) SEMICONDUCTOR DEVICE AND ITS MANUFACTURING METHOD

(75) Inventors: Shunpei Yamazaki, Tokyo; Hideomi Suzawa; Satoshi Teramoto, both of Kanagawa, all of (JP)

(73) Assignee: Semiconductor Energy Laboratory Co., Ltd., Kanagawa-Ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/769,371

(22) Filed: Dec. 19, 1996

(30) Foreign Application Priority Data

Dec. 20, 1995 (JP) ................................................. 7-349667
Dec. 25, 1995 (JP) ................................................. 7-351445
Jan. 16, 1996 (JP) ................................................. 8-023073

(51) Int. Cl.$^7$ ...................... H01L 21/00; H01L 21/3205; H01L 21/44
(52) U.S. Cl. .................... 438/660; 438/149; 438/586; 438/605; 438/661; 438/662; 438/663
(58) Field of Search .................... 438/149, 586, 438/632, 646, 660–663, 608, 605

(56) References Cited

U.S. PATENT DOCUMENTS

| 4,103,297 | 7/1978 | McGreivy et al. ................... 340/324 |
| 4,239,346 | 12/1980 | Lloyd .................... 350/334 |
| 4,502,210 | * 3/1985 | Okumura et al. ....................... 29/591 |
| 4,618,878 | 10/1986 | Aoyama et al. ......................... 357/71 |
| 4,680,580 | 7/1987 | Kawahara ............................ 340/784 |
| 4,818,077 | 4/1989 | Ohwada et al. ....................... 350/350 |
| 4,853,760 | 8/1989 | Abe et al. .............................. 357/52 |
| 4,938,565 | 7/1990 | Ichikawa .............................. 350/332 |
| 4,949,141 | 8/1990 | Busta .................................... 357/23.7 |
| 5,002,464 | 3/1991 | Lee ....................................... 417/152 |
| 5,003,356 | 3/1991 | Wakai ...................................... 357/4 |
| 5,012,228 | 4/1991 | Masuda et al. ....................... 340/702 |
| 5,051,570 | 9/1991 | Tsujikawa et al. ............... 250/201.1 |
| 5,055,899 | 10/1991 | Wakai et al. ......................... 357/23.7 |
| 5,056,895 | 10/1991 | Kahn ..................................... 359/87 |
| 5,084,905 | 1/1992 | Sasaki et al. ......................... 357/71 |
| 5,117,278 | 5/1992 | Bellersen et al. ...................... 357/72 |
| 5,169,803 | * 12/1992 | Miyakawa ............................ 438/625 |
| 5,327,001 | 7/1994 | Wakai et al. ......................... 257/350 |
| 5,371,398 | 12/1994 | Nishihara ............................. 257/435 |

(List continued on next page.)

FOREIGN PATENT DOCUMENTS

| 55-32026 | 3/1980 | (JP) . |
| 59-72745 | 4/1984 | (JP) . |
| 61-141174 | 6/1986 | (JP) . |
| 1-156725 | 6/1989 | (JP) . |
| 1-283839 | 11/1989 | (JP) . |

OTHER PUBLICATIONS

Kim, et al.; 4.4: Planarized Black Matrix on TFT Structure for TFT–LCD Monitors; 1997; Kiheung, Korea; SID 97 Digest, pp. 19–22.

* cited by examiner

Primary Examiner—John F. Niebling
Assistant Examiner—Ha Tran Nguyen
(74) Attorney, Agent, or Firm—Fish & Richardson PC

(57) ABSTRACT

A film containing such an element as germanium or tin is formed on a wiring electrode mainly made of aluminum. A wiring film to take contact to the wiring electrode is further formed thereon. The film containing the above element is rendered flowable by performing a heat treatment. This process allows formation of a reliable contact.

71 Claims, 14 Drawing Sheets

U.S. PATENT DOCUMENTS

| | | | |
|---|---|---|---|
| 5,495,353 | 2/1996 | Yamazaki | 359/54 |
| 5,499,123 | 3/1996 | Mikoshiba | 359/59 |
| 5,534,463 | 7/1996 | Lee et al. | 438/643 |
| 5,604,380 | 2/1997 | Nishimura et al. | 257/758 |
| 5,610,100 * | 3/1997 | Kurino et al. | 437/195 |
| 5,612,799 | 3/1997 | Yamazaki | 349/42 |
| 5,641,974 | 6/1997 | den Boer et al. | 257/59 |
| 5,693,541 | 12/1997 | Yamazaki et al. | 438/486 |
| 5,779,925 | 7/1998 | Hashimoto et al. | 216/67 |
| 5,830,786 | 11/1998 | Zhang et al. | 438/163 |
| 5,843,843 | 12/1998 | Lee et al. | 438/688 |
| 5,846,877 * | 12/1998 | Kim | 438/625 |
| 5,869,902 * | 2/1999 | Lee et al. | 257/773 |
| 5,880,023 * | 3/1999 | Jun | 438/652 |
| 5,913,146 | 6/1999 | Merchant et al. | 438/646 |

| 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|
| 1 H | | | | | | | | | | | | | | | | | 2 He |
| 3 Li | 4 Be | | | | | | | | | | | 5 B | 6 C | 7 N | 8 O | 9 F | 10 Ne |
| 11 Na | 12 Mg | | | | | | | | | | | 13 Al | 14 Si | 15 P | 16 S | 17 Cl | 18 Ar |
| 19 K | 20 Ca | 21 Sc | 22 Ti | 23 V | 24 Cr | 25 Mn | 26 Fe | 27 Co | 28 Ni | 29 Cu | 30 Zn | 31 Ga | 32 Ge | 33 As | 34 Se | 35 Br | 36 Kr |
| 37 Rb | 38 Sr | 39 Y | 40 Zr | 41 Nb | 42 Mo | 43 Tc | 44 Ru | 45 Rh | 46 Pd | 47 Ag | 48 Cd | 49 In | 50 Sn | 51 Sb | 52 Te | 53 I | 54 Xe |
| 55 Cs | 56 Ba | 57-71 * | 72 Hf | 73 Ta | 74 W | 75 Re | 76 Os | 77 Ir | 78 Pt | 79 Au | 80 Hg | 81 Tl | 82 Pb | 83 Bi | 84 Po | 85 At | 86 Rn |
| 87 Fr | 88 Ra | 89-103 ** | 104 Unq | 105 Unp | 106 Unh | 107 Uns | | | | | | | | | | | |

*LANTHANOIDS
**ACTINOIDS

| * | 57 La | 58 Ce | 59 Pr | 60 Nd | 61 Pm | 62 Sm | 63 Eu | 64 Gd | 65 Tb | 66 Dy | 67 Ho | 68 Er | 69 Tm | 70 Yb | 71 Lu |
|---|---|---|---|---|---|---|---|---|---|---|---|---|---|---|---|
| ** | 89 Ac | 90 Th | 91 Pa | 92 U | 93 Np | 94 Pu | 95 Am | 96 Cm | 97 Bk | 98 Cf | 99 Es | 100 Fm | 101 Md | 102 No | 103 Lr |

FIG. 11

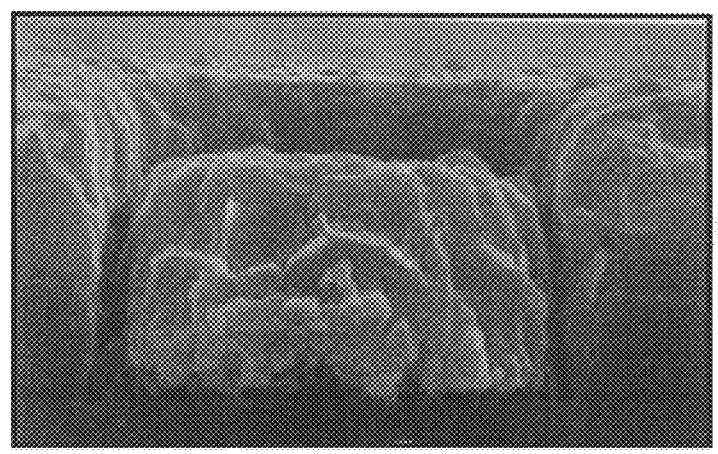
FIG. 14A  1μm
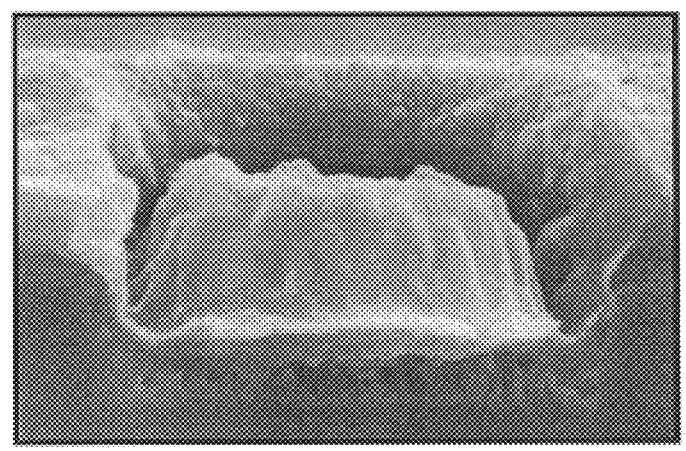
FIG. 14B  1μm
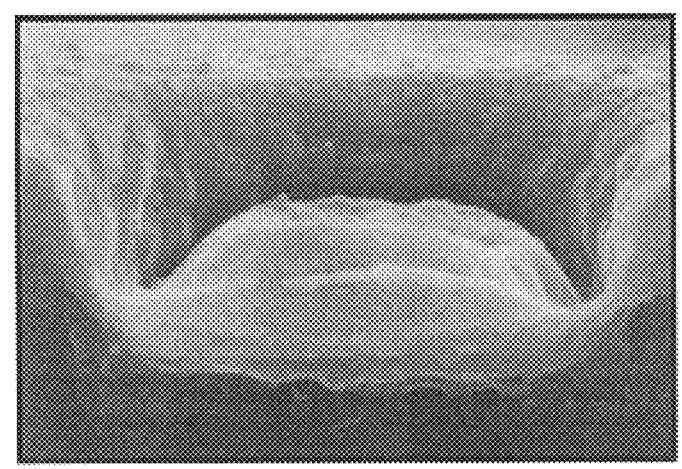
FIG. 14C  1μm

SEMICONDUCTOR DEVICE AND ITS MANUFACTURING METHOD

BACKGROUND OF THE INVENTION

1. Field of the Invention

The present invention relates to a semiconductor device in which electrodes and wiring lines made only or mainly of aluminum are formed, as well as to a manufacturing method of such a semiconductor device.

2. Description of the Related Art

In recent years, with an increased demand for active matrix liquid crystal display devices, techniques for forming a thin-film transistor (hereinafter abbreviated as "TFT") on a glass substrate, which is inexpensive, have been developed rapidly. In an active matrix liquid crystal display device, a TFT (hereinafter referred to as "pixel TFT") provided for each of millions of pixels that arranged in matrix controls charge entering and exiting from the associated pixel electrode by its switching function.

An integrated circuit is now common in which TFTs (called "circuit TFTs" for convenience) for driving the pixel TFTs are incorporated in peripheral driver circuits and a display pixel section including the pixel TFTs and a driver circuit section including the circuit TFTs are formed on the same substrate.

This type of integrated circuit includes millions of pixel TFTs and more than several hundred circuit TFTS. It is natural that an integrated circuit of such a configuration have a problem of a low production yield. For example, if a single pixel TFT does not operate properly, the pixel electrode connected thereto loses its function as a display element. This causes what is called a point defect. In the case of a normally-black liquid crystal display device, a point defect causes a black point in a white display area, which much deteriorates a visual impression.

On the other hand, if a circuit TFT does not operate properly, all the pixel TFTs that receive a drive voltage from that circuit TFT do not function as switching elements. This causes what is called a line defect, which is fatal to the liquid crystal display device.

Therefore, in an active matrix liquid crystal display device, millions of TFTs are required to continue their normal and stable operations over a long time. However, it is currently very difficult to completely eliminate point detects and line defects.

The above-mentioned point defect and line defect are mainly caused by an operation failure of a TFT. One of the main causes of TFT operation failures is a contact failure. The contact failure occurs at an electrical connecting portion (hereinafter called a contact) between a wiring electrode and a TFT active layer (composed of thin-film semiconductor layer) or a gate electrode. In particular, the contact failure is serious in planar TFTs in which electrical connection between a wiring electrode and a TFT is taken through a narrow hole (contact hole).

The contact failure is the main cause of early degradation in the semiconductor device characteristics. The degradation is particularly accelerated in a case of large-current or high-temperature operation. This is the reason for an extreme notion that the reliability of contacts determines that of a semiconductor device.

In general, in the pixel display region of an active matrix liquid crystal display device, there exist only contacts to TFT active layers because gate electrodes themselves extend outside the pixel display region.

On the other hand, the peripheral driver circuits include hundreds of thousands to millions of contacts. The contacts in the peripheral driver circuits are required to be more reliable than those in the pixel display region, particularly because gate electrodes have contacts and a large-current operation causes temperature increase.

Causes of contact failures are generally classified into the following three categories.

The first cause is such that a conductive film constituting a wiring electrode and a semiconductor film constituting the source or drain of a TFT do not form an ohmic contact. For example, this is caused by an insulative coating such as a metal oxide film formed on the junction surface. Further, the states (impurity concentration, density of defect energy states, cleanliness, etc.) of the surface and its vicinity of a semiconductor film greatly influence the contact performance.

The second cause is such that poor coverage of a conductive film constituting a wiring line causes a disconnection in a contact hole. This type of contact failure needs to be remedied by employing a proper method and conditions for forming a wiring electrode.

The third cause is a disconnection of a wiring electrode resulting from the sectional shape, for instance, of a contact hole, which strongly depends on the conditions for etching an insulating layer (SiN, $SiO_2$, etc.) covering the contact portion. In particular, a side recess and blowholes that are formed by overetching cause serious problems because they very much deteriorate the coverage. To illustrate one of those problems, a description will be made of how a side recess is formed in a gate electrode with reference to FIGS. 1A–1C.

FIGS. 1A–1C are enlarged views of a contact hole for taking contact between a gate electrode of a planar thin-film transistor and a wiring line.

In FIG. 1A, reference numeral 101 denotes a member made of a metal material capable of being anodized, more specifically, a gate electrode made of a material mainly made of Al (aluminum). For simplicity, a gate insulating film, a semiconductor layer, etc. existing under the gate electrode 101 are not shown in FIGS. 1A–1C.

Reference numeral 102 denotes an anodic oxide film (mainly made of $Al_2O_3$) formed by anodizing the gate electrode 101 in an electrolyte. Being very dense and strong, the anodic oxide film 102 serves to protect the gate electrode 101 from heat applied thereon in a heat treatment, to thereby suppress occurrence of hillocks and whiskers. Hillocks and whiskers are needle or prickle-like protrusions formed by abnormal growth of aluminum.

An interlayer insulating film 103, which may be a silicon oxide film, a silicon nitride film, a silicon oxynitride film, or the like, is formed on the gate electrode 101.

As shown in FIG. 1A, a contact hole 104 is formed through the interlayer insulating film 103 by etching it by wet etching or dry etching.

To complete the contact hole 104, it is necessary to etch the interlayer insulating film 103 which is a silicide film and then etch the anodic oxide film 102.

However, since the anodic oxide film 102 is very dense and strong, it takes certain time to etch it. Therefore, in the case of isotropic etching, the etching proceeds also laterally to a considerable extent, to form a side recess 105 as shown in FIG. 1B.

Formation of a wiring electrode 106 in this state results in a structure shown in FIG. 1C. Since the side recess 105 cannot be covered with the wiring electrode 106 completely, there is a possibility of disconnection. Further, this often causes a contact failure.

If the overetching at the end of the etching of the anodic oxide film 102 is too long, the gate electrode 101 is etched little by little, possibly forming blowholes. This may also cause a contact failure.

Further, upon exposure of the aluminum gate electrode 101, a natural oxide film is formed on its surface. The existence of the natural oxide film may also cause a contact failure.

Although the above problems can be avoided by using, as the electrode material, a metal material other than aluminum, a silicide material, or some other proper material, such a solution is not always proper in view of the low-resistivity characteristic of aluminum.

SUMMARY OF THE INVENTION

An object of the present invention is to reduce the rate of occurrence of TFT operation failures due to contact failures, by solving the above problems.

That is, it is an object of the invention to improve the long-term reliability of a TFT or a liquid crystal display device by improving the reliability of contacts. Another object of the invention is to improve the yield of a manufacturing process by eliminating point defects and line defects.

In particular, it is an object of the invention to provide a technique for eliminating contact failures in a case where aluminum or a material mainly made of aluminum is used to constitute an electrode.

According to one aspect of the invention, there is provided a manufacturing method of a semiconductor device, comprising the steps of, in a structure including an aluminum layer made only or mainly of aluminum and an insulating film formed on the aluminum layer, forming a contact hole through the insulating film, to expose the aluminum layer in a bottom portion of the contact hole; forming, at least in the bottom portion of the contact hole, a first film made of an element belonging to groups 12 to 15 or containing the element at a given amount; forming a second film to constitute a wiring line on the first film; and performing a heat treatment to thereby render the first film flowable.

In the above manufacturing method, wherein the elements belonging to groups 12 to 15 (previously, groups 2B–5B) mean the elements from Zn to Bi in the periodic table of the elements shown in FIG. 11. The given amount means an amount that is controlled intentionally in introducing the element.

In particular, the element belonging to groups 12 to 15 is one or a plurality of elements selected from the group consisting of germanium, tin, gallium, zinc, indium, and antimony.

The invention is effective particularly in a case where aluminum or a material mainly made of aluminum is used to form the wiring line.

According to another aspect of the invention, there is provided a manufacturing method of a semiconductor device, comprising the steps of, in a structure including a semiconductor layer and an insulating film formed on the semiconductor layer, forming a contact hole through the insulating film, to expose the semiconductor layer in a bottom portion of the contact hole; forming, at least in the bottom portion of the contact hole, a first film made of an element belonging to groups 12 to 15 or containing the element at a given amount; forming a second film made only or mainly of aluminum on the first film; and performing a heat treatment to thereby render the first film flowable.

According to a further aspect of the invention, there is provided a semiconductor device comprising an aluminum layer made only or mainly of aluminum; an insulating film formed on the aluminum layer; a contact hole formed through the insulating film; a wiring film being in contact with the aluminum layer in the contact hole; and an element that belongs to groups 12 to 15 existing at a boundary between the aluminum layer and the wiring film and/or a vicinity thereof at a higher concentration than in the other regions.

According to another aspect of the invention, there is provided a semiconductor device comprising two films made only or mainly of aluminum being in contact with each other; and an element that belongs to groups 12 to 15 existing at a boundary between the two films and/or a vicinity thereof at a higher concentration than in the other regions.

According to another aspect of the invention, there is provided a manufacturing method of a semiconductor device, comprising the steps of forming two films constituting said semiconductor device and made only or mainly of aluminum being in contact with each other; forming a layer made of an element belonging to groups 12 to 15 or containing the element at a given amount between the above two films; and performing a heat treatment to thereby render the layer flowable.

According to still another aspect of the invention, there is provided a manufacturing method of an insulated-gate field-effect semiconductor device, comprising the steps of forming a wiring electrode made only or mainly of aluminum which is electrically connected to at least part of the semiconductor device through a contact hole formed through an interlayer insulating film; and performing a heat treatment to thereby render the wiring electrode substantially flowable, wherein the wiring electrode is added with one or a plurality of elements which render the wiring electrode flowable at less than 450° C.

In the above manufacturing method, in a case where the wiring electrode is made of aluminum or a material mainly made of aluminum, the step of rendering the wiring electrode flowable (reflow step) should be performed at less than 450° C. in view of the heat resistance of aluminum.

Examples of the element for rendering the wiring electrode flowable at less than 450° C. are the above-mentioned elements belonging to groups 12 to 15, for instance, germanium, tin, gallium, zinc, lead, indium, and antimony. For example, it is desirable that germanium be contained at 20–40 atomic % (the rest corresponds to aluminum).

According to another aspect of the invention, there is provided a manufacturing method of an insulated-gate field-effect semiconductor device, comprising the steps of forming a wiring electrode mainly made of aluminum and containing germanium at 20–40 atomic %; forming a metal thin film mainly made of titanium before and/or after forming the wiring electrode; and performing a heat treatment to thereby render the wiring electrode substantially flowable.

According to another aspect of the invention, there is provided a manufacturing method of an insulated-gate field-effect semiconductor device, comprising the steps of forming a multilayer film including a thin film mainly made of germanium and a thin film mainly made of aluminum which multilayer film is electrically connected to at least part of the semiconductor device through a contact hole formed through an interlayer insulating film; and performing a heat treatment to thereby render the multilayer film substantially flowable.

That is, the multilayer film including the thin film mainly made of germanium and the thin film mainly made of aluminum which multilayer film is formed in the contact hole is subjected to the heat treatment, to form a compound layer, i.e., an alloy layer. Naturally the alloy layer is easily rendered flowable by a reflow process of less than 450° C.

The heating means of the reflow process may be either a heating means using an electric heating furnace or a means of applying strong light such as ultraviolet light or infrared light. A technique called RTA (rapid thermal annealing) is known as an example of the latter heating means.

According to a further aspect of the invention, there is provided a semiconductor device comprising an aluminum layer made only or mainly of aluminum; an insulating film formed on the aluminum layer; a contact hole formed through the insulating film; a wiring film being in contact with the aluminum layer in the contact hole; and an element that belongs to groups 12 to 15 existing at a boundary between the aluminum layer and the wiring film and/or a vicinity thereof at a higher concentration than in the other regions.

According to another aspect of the invention, there is provided a semiconductor device comprising two films made only or mainly of aluminum being in contact with each other; and an element that belongs to groups 12 to 15 existing at a boundary between the two films and/or a vicinity thereof at a higher concentration than in the other regions.

According to still another aspect of the invention, there is provided an insulated-gate field-effect semiconductor device comprising a wiring electrode made only or mainly of aluminum which is electrically connected to at least part of the semiconductor device through a contact hole formed through an interlayer insulating film; and an element contained in the wiring electrode which element renders the wiring electrode flowable at less than 450° C.

A specific example of the invention will be described below. Referring to FIG. 3C, an aluminum wiring line 317 is brought into contact with an aluminum gate electrode 208 in the following manner. After a gate contact hole is formed as shown in FIG. 3A, a germanium film 300 is formed. Thereafter, an aluminum film 315 is formed and a heat treatment (reflow process) is performed.

A mixed layer 320 of aluminum and germanium is formed by the above reflow process, as a result of which a gap in the contact portion is filled in and a natural oxide film formed on the exposed surface of the aluminum electrode 208 is removed. Thus, a superior contact is formed.

BRIEF DESCRIPTION OF THE DRAWINGS

FIG. 11 shows the periodic table of the elements;

FIGS. 14A–14C are SEM photographs showing cross-sections of contact holes.

DETAILED DESCRIPTION OF THE PREFERRED EMBODIMENTS

EMBODIMENT 1

Figure 1A:
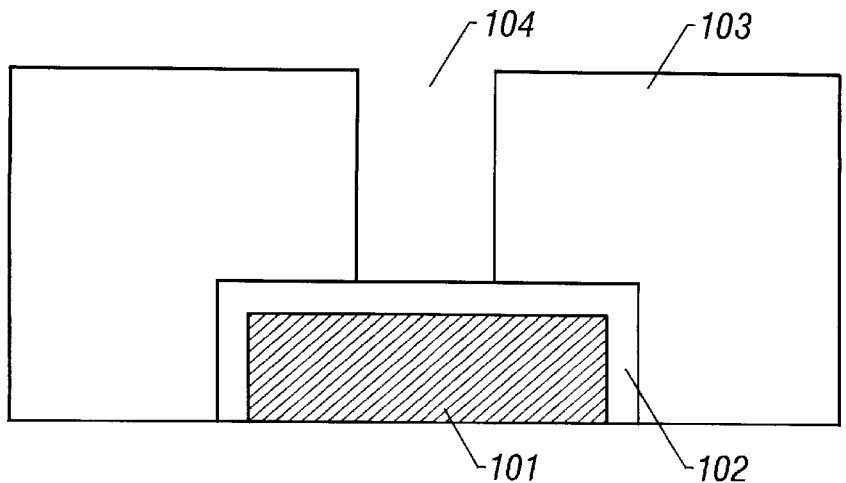
FIGS. 1A–1C are enlarged sectional views of a contact hole.
Figure 1B:
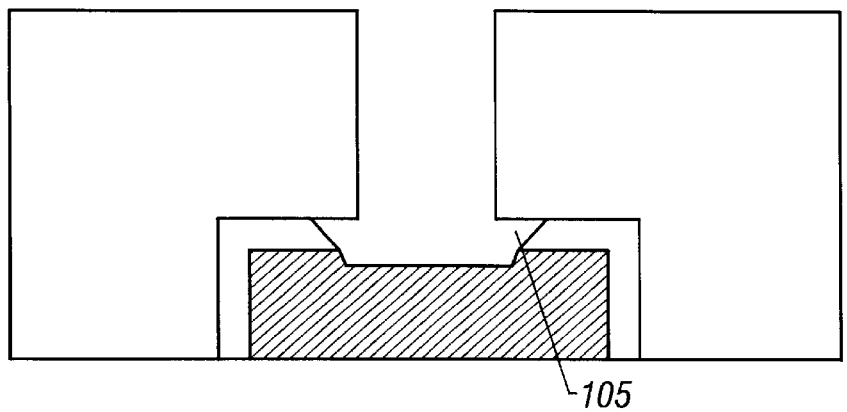
Figure 1C:
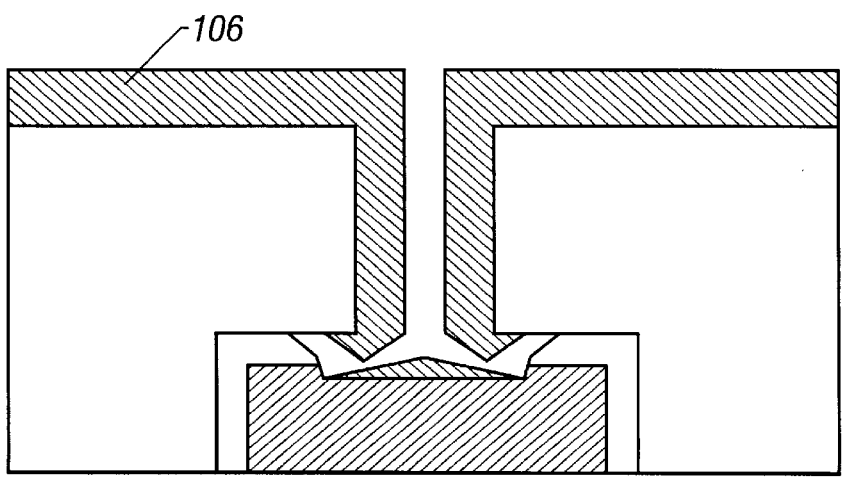

This embodiment is directed to a case of performing a reflow process using an alloy of aluminum, germanium, and copper. FIGS. 2A–2D and FIGS. 3A–3C show a manufacturing process of a thin-film transistor (TFT) according to this embodiment.

First, a glass substrate 201 having an insulating surface is prepared, and a 2,000 Å thick silicon oxynitride film ($SiO_xN_y$) 202 is formed as an undercoat film.

A quartz substrate may also be used instead of the glass substrate. In an integrated circuit having a multilayered structure, a proper insulating film may be used as a substrate. Further, a silicon oxide film or a silicon nitride film may also be used as the undercoat film.

A 500 Å thick amorphous silicon film (not shown) is formed on the silicon oxynitride film 202 by plasma CVD or low-pressure thermal CVD, and then crystallized by a proper crystallization method such as heating or laser light illumination. An element (for instance, Ni) for accelerating crystallization may be added in the crystallization step.

Next, a crystalline silicon film obtained by crystallizing the amorphous silicon film is patterned into an island-like semiconductor layer 203 which will constitute an active layer.

A 1,500 Å thick silicon oxide film 204 to later serve as a gate insulating film is formed on the above structure by plasma CVD or low-pressure thermal CVD.

Next, a 4,000 Å thick metal thin film 205 made of aluminum or a material mainly made of aluminum is formed. The aluminum film 205 will serve as a gate electrode. Naturally there may be used other materials capable of being anodized such as tantalum and niobium.

Subsequently, anodization is conducted in an electrolyte with the aluminum film 205 used as the anode. The electrolyte is obtained by neutralizing (pH=6.92) an ethylene glycol solution containing tartaric acid at 3% with ammonia. Platinum is used as the cathode. The formation current is set at 5 mA, and the application voltage is increased up to 10 V.

A dense anodic oxide film (not shown) formed on the surface of the aluminum film 205 in the above manner is effective in increasing the adhesiveness of a photoresist later used. The thickness of the dense anodic oxide film can be controlled by the voltage application time. (FIG. 2A)

Figure 2A:
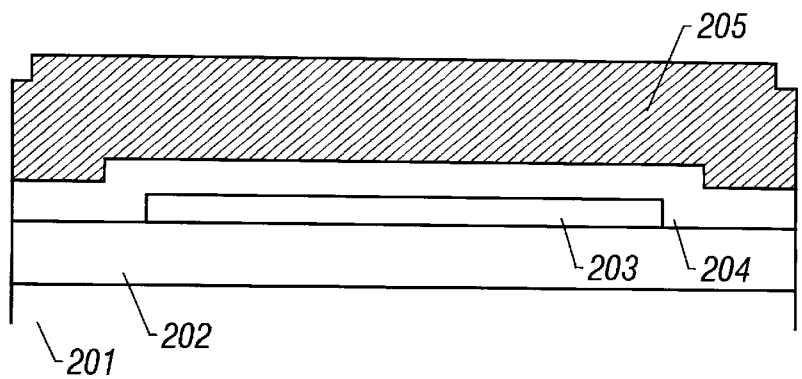
FIGS. 2A–2D and 3A–3C show a manufacturing process of a TFT according to a first embodiment of the present invention.

Once the state of FIG. 2A is obtained, the aluminum film 205 is patterned with the use of a resist mask (not shown), into an aluminum electrode (not shown) from which a gate electrode and an anodic oxide film are to be formed.

Next, second anodization is performed to form a porous anodic oxide film 206. An aqueous solution containing oxalic acid at 3% is used as an electrolyte. Platinum is used as the cathode. The formation current is set at 2–3 mA, and the application voltage is increased up to 8 V.

This anodization proceeds parallel with the substrate 201, and does not proceed on the top surface of the aluminum electrode because of the existence of the resist mask (not shown).

The thickness of the porous anodic oxide film 206 is controlled by the voltage application time. In this embodiment, it is set at 0.7 μm.

After the resist mask is removed with a remover exclusively used therefor, third anodization is performed. Thus, the state of FIG. 2B is obtained.

This anodization uses an electrolyte obtained by neutralizing (pH=6.92) an ethylene glycol solution containing tartaric acid at 3% with ammonia. Platinum is used as the cathode. The formation current is set at 5–6 mA, and the application voltage is increased up to 100 V.

Since a resulting anodic oxide film 207 is very dense and strong, it has an effect of protecting the gate electrode 208 from being damaged in a later step such as a doping step as well as from heat in a heating step.

Figure 2B:
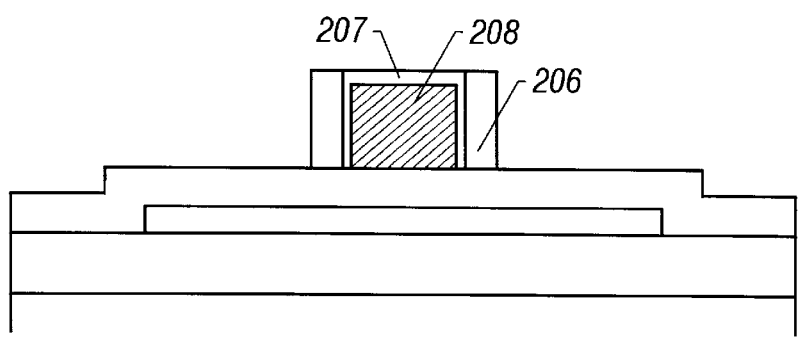

In this anodization, the anodic oxide film 207 is formed as shown in FIG. 2B because the electrolyte enters into the porous anodic oxide film 206. A portion of the aluminum electrode which is left non-anodized becomes an actual gate electrode 208.

Next, an impurity is implanted into the island-like semiconductor layer 203 by ion doping. In this embodiment, an impurity of P (phosphorus) is implanted to form an n-channel TFT. If a p-channel TFT is to be formed, B (boron) is implanted.

First ion doping is performed in the state of FIG. 2B. The P implantation is performed with the acceleration voltage and the dose set at 60–90 kV (for example, 80 kV) and $0.2–5 \times 10^{15}$ atoms/cm$^2$ (for example, $1 \times 10^{15}$ atoms/cm$^2$), respectively.

Since the gate electrode 208 and the porous anodic oxide film 206 serve as a mask, regions 209 and 210 to later become source and drain regions are formed in a self-aligned manner. (see FIG. 2C)

Figure 2C:
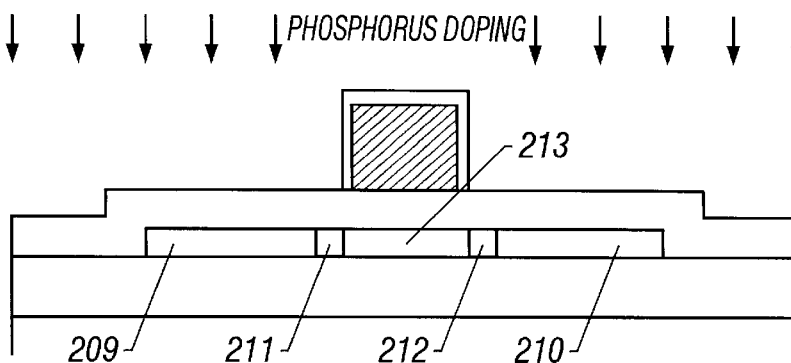

Then, as shown in FIG. 2C, second doping is performed after the porous anodic oxide film 206 is removed. The P implantation is performed with the acceleration voltage and the dose set at 60–90 kV (for example, 80 kV) and $0.1–5 \times 10^{14}$ atoms/cm$^2$ (for example, $1 \times 10^{14}$ atoms/cm$^2$), respectively.

Since the gate electrode 208 serves as a mask, low-concentration impurity regions 211 and 212 having a lower impurity concentration than the source and drain regions 209 and 210 are formed in a self-aligned manner.

Since the impurity is not implanted at all into the region right under the gate electrode 208, a region 213 to later become the channel of a TFT is formed at the same time in a self-aligned manner. Further, offset regions (not shown) are formed which are as thick as the anodic oxide film 207 and to which a gate voltage is not applied.

The low-concentration impurity region 212, which is generally called LDD (lightly doped drain), has an effect of preventing a strong electric field from being formed between the channel region 213 and the drain region 210.

Next, illumination with KrF excimer laser light and thermal annealing are performed. In this embodiment, the laser light energy density is set at 250–300 mJ/cm$^2$, and the thermal annealing is performed at 300° C.–450° C. for one hour.

These steps can improve the crystallinity of the island-like semiconductor layer 203 that was damaged in the ion doping step. The crystallinity can further be improved by additionally performing a hydrogenation treatment of 350° C. and one hour.

Figure 2D:
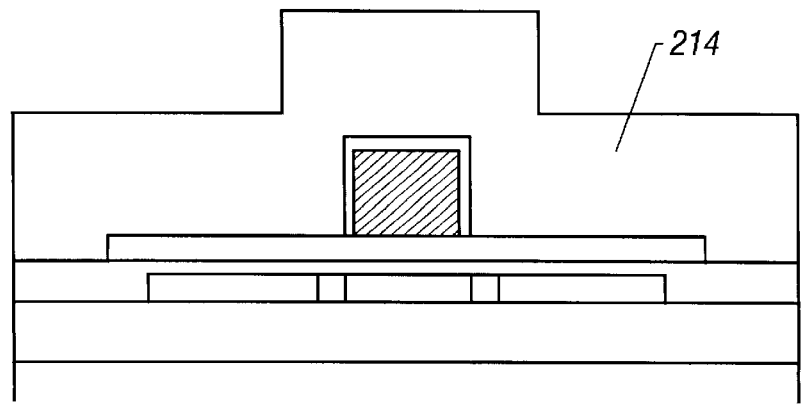

Subsequently, as shown in FIG. 2D, a first interlayer insulating film 214 of a silicon oxynitride film is formed by plasma CVD. The interlayer insulating film 214 may also be a silicon oxide film or a silicon nitride film, or even a multilayer film.

Next, contact holes for electrically connecting a source electrode and a gate electrode to the TFT are formed by wet etching that uses a buffered hydrofluoric acid. At this time, the source contact hole (i.e., contact hole for the active layer) and the gate contact hole (i.e., contact hole for the gate electrode 208) are formed at the same time. This technique is desirable to reduce the number of patterning steps and simplify the process.

As for the source contact portion, the first interlayer insulating film 214 and the gate insulating film 204 are etched in this order, so that the source region 209 of the island-like semiconductor layer 203 is exposed. In this state, the anodic oxide film 207 is still being etched in the gate contact portion because of a low etching rate thereof.

If the anodic oxide film 207 is etched with a hydrofluoric acid type etchant, the etching proceeds non-uniformly and hence the gate electrode 208 is also etched from its portions into which the etchant is penetrated. Therefore, when the etching of the anodic oxide film 207 is completed, overetching has occurred in the source contact portion and the gate electrode 208 has been eroded in the gate contact portion, to form contact holes having side recesses as shown in FIG. 3A.

This phenomenon, which occurs unavoidably though its extent depends on each occasion, is a major cause of a contact failure.

This problem can be solved by forming the two contact holes individually, which however increases the number of photolithography steps and is disadvantageous in terms of simplification of the process (cost reduction).

Figure 3A:
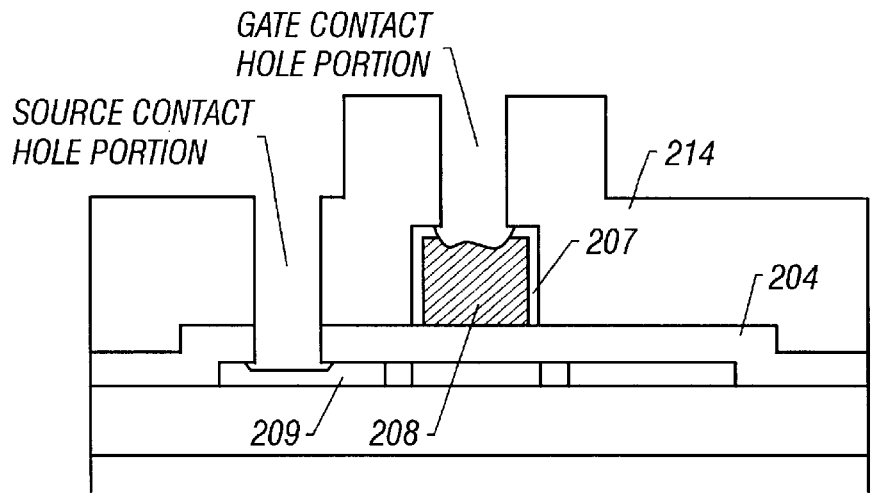

This embodiment employs the following process to enable reliable formation of contacts even starting from the state of FIG. 3A.

Figure 3B:
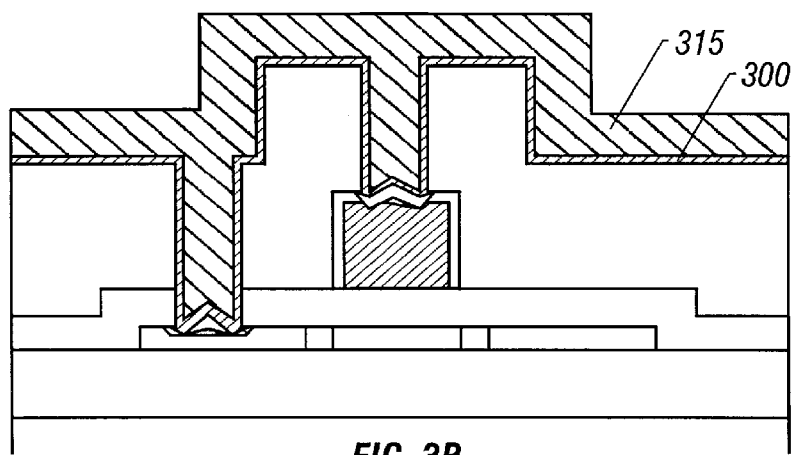

After the contact holes are formed as shown in FIG. 3A, a very thin germanium film 300 is formed at a thickness of 200–300 Å by plasma CVD as shown in FIG. 3B. The film forming conditions are as follows:

Film forming temperature . . . 200° C.
    Film forming gases . . . GeH$_4$: 20 sccm; H$_2$: 380 sccm
    Film forming pressure . . . 1.0 Torr
    Application power . . . 20 W
    Next, a 4,000 Å thick metal thin film 315 is formed by sputtering. In this embodiment, the metal thin film 315 is made of aluminum containing copper at 2 wt %. Copper is added to suppress occurrence of hillocks and whiskers, which would otherwise be caused by abnormal growth of aluminum.

In this state, the side recesses and blowholes are not covered completely, and therefore it is highly possible that a disconnection occurs within the contact holes (see FIG.

Figure 13A:
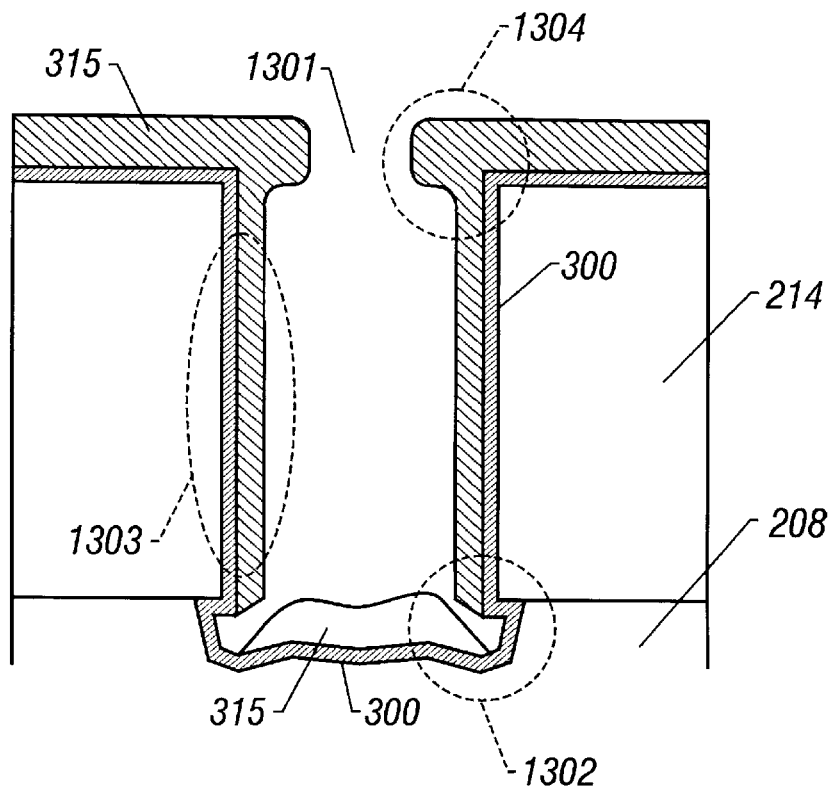
FIGS. 13A and 13B are sectional view of a contact hole.

3B). Referring to FIG. 13A, a detailed description will be made of the contact hole that is formed above the gate electrode 208.

FIG. 13A is a sectional view of a contact hole 1301 formed through the interlayer insulating film 214 that is formed on the gate electrode 208. The germanium film 300 and the metal thin film 315 are formed in the contact hole 1301. That is, FIG. 13A is an enlarged sectional view of the contact hole formed above the gate electrode 208 in FIG. 3B.

As shown in FIG. 13A, it is highly possible that in the as-formed state the metal thin-film 315 is disconnected at the bottom portion of the contact hole 1301 (indicated by circle 1302) due to insufficient coverage.

Further, because of difficulty in forming a thick film on the side wall of the contact hole 1301 by sputtering, in many cases the thickness of the metal thin film 315 is much smaller than a desired value (indicated by circle 1303).

It may also occur that the metal thin film 315 overhangs at the inlet of the contact hole 1301 (indicated by circle 1304) possibly to such an extent that the inlet is closed to form a cusp in the contact hole 1301.

To avoid the above problems, in the invention a reflow step is performed in this state. That is, the metal thin film 315 is heated to become flowable, whereby the contact between the aluminum electrode 208 and the aluminum thin film 315 is made reliable.

In view of the heat resistance of the gate electrode 208, it is necessary that the reflow step be performed in a temperature range of 375° C.–450° C. (In this embodiment, the heat resistance is higher than ordinary cases because the aluminum electrode 208 is covered with the anodic oxide film 207.)

In this embodiment, a heat treatment of 450° C. and one hour is conducted in an electric heating furnace in a vacuum, an inert gas such as nitrogen, or a hydrogen atmosphere.

In the heat treatment, first a reaction occurs at the boundary between the germanium film 300 and the metal thin film 315, to form an alloy layer 320 composed of aluminum, copper, and germanium.

This reaction gradually expands as germanium and aluminum diffuse, so that a bottom layer of the metal thin film 315 comes to contain germanium and becomes flowable at 400° C. to effect the intended reflow process.

As a result, the metal thin film 315 flows to cover the side recess and the blowholes, i.e., repair disconnected portions. Thus, proper connection is established at all the disconnected portions and contact failure portions of the metal thin film 315, so that the electrical connection between the metal thin film 315 and the gate electrode 208 (or source region 209) is made complete.

Figure 13B:
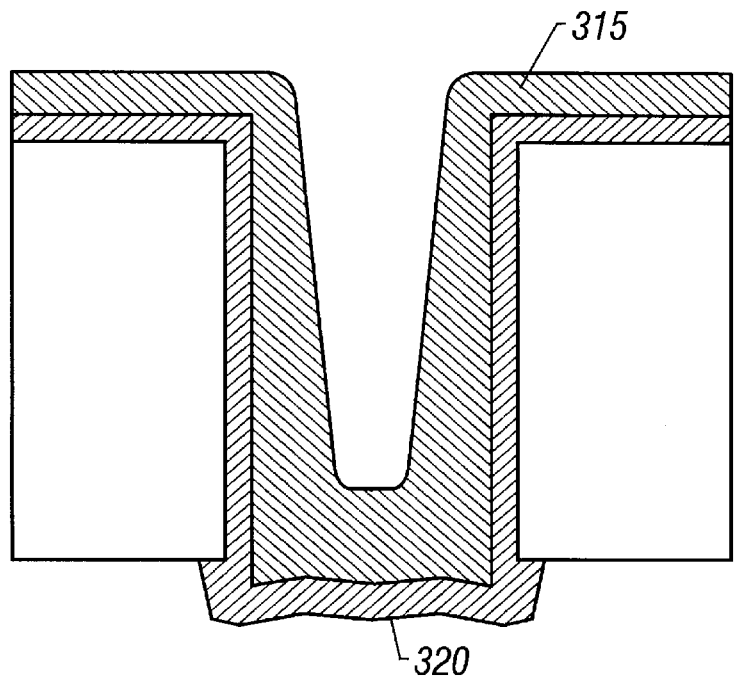

FIG. 13B is an enlarged sectional view of a contact hole in a state that the reflow step is completed. The metal thin film 315 that is rendered flowable temporarily covers disconnected portions and contact failure portions and fills in the contact hole. The bottom layer of the metal thin film 315 is converted into an alloy layer 320.

The natural oxide film on the exposed surface of the gate electrode 208 is removed in the reflow step, thereby avoiding a contact failure resulting from it.

Figure 4:
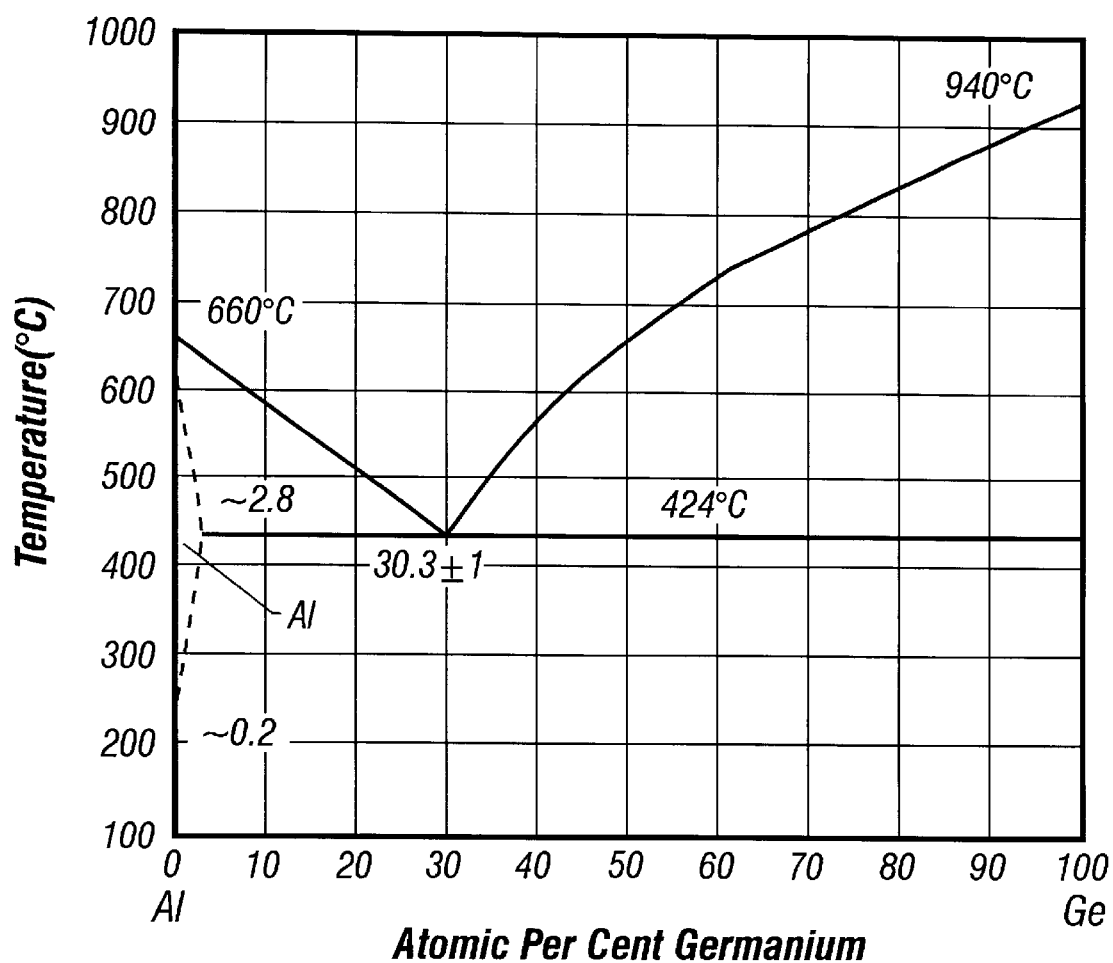
FIG. 4 is a phase chart of a binary alloy of aluminum and germanium.
Figure 5:
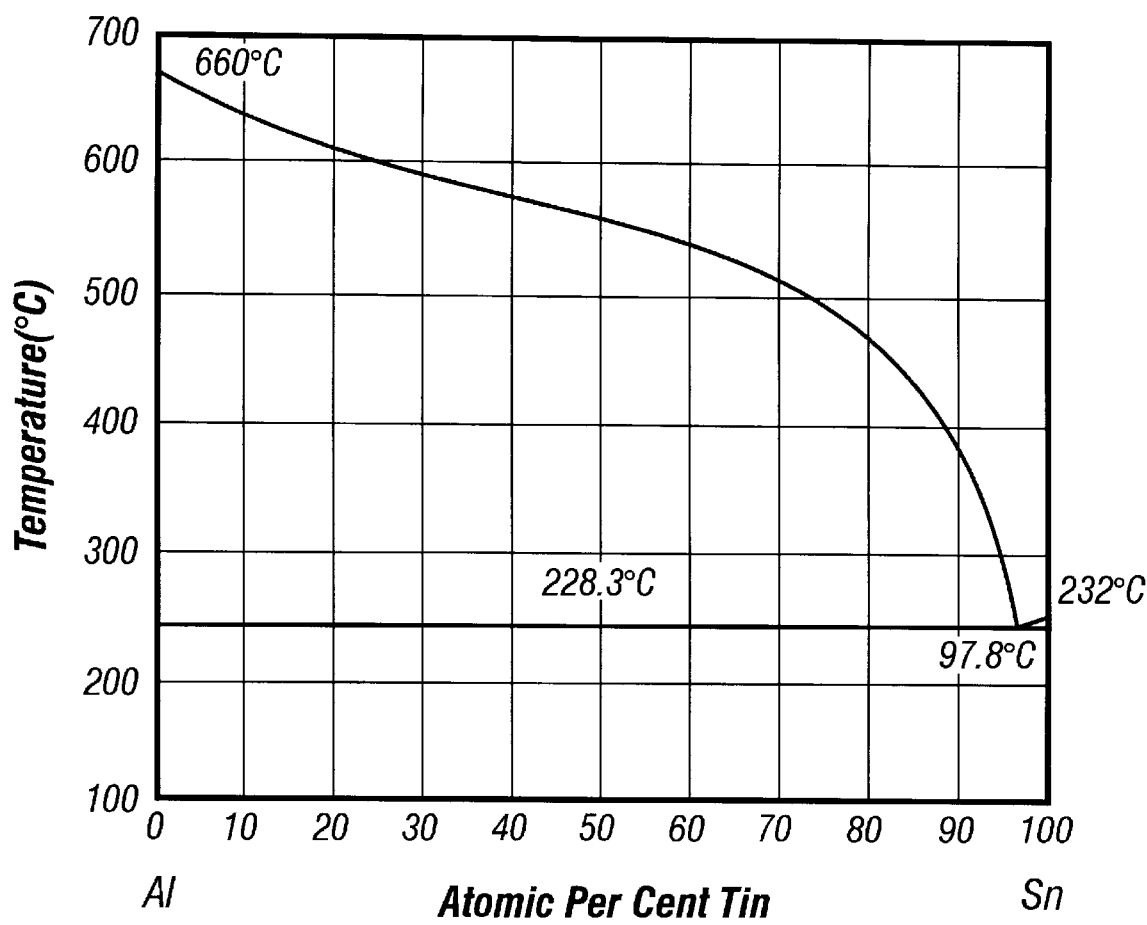
FIG. 5 is a phase chart of a binary alloy of aluminum and tin.
Figure 6:
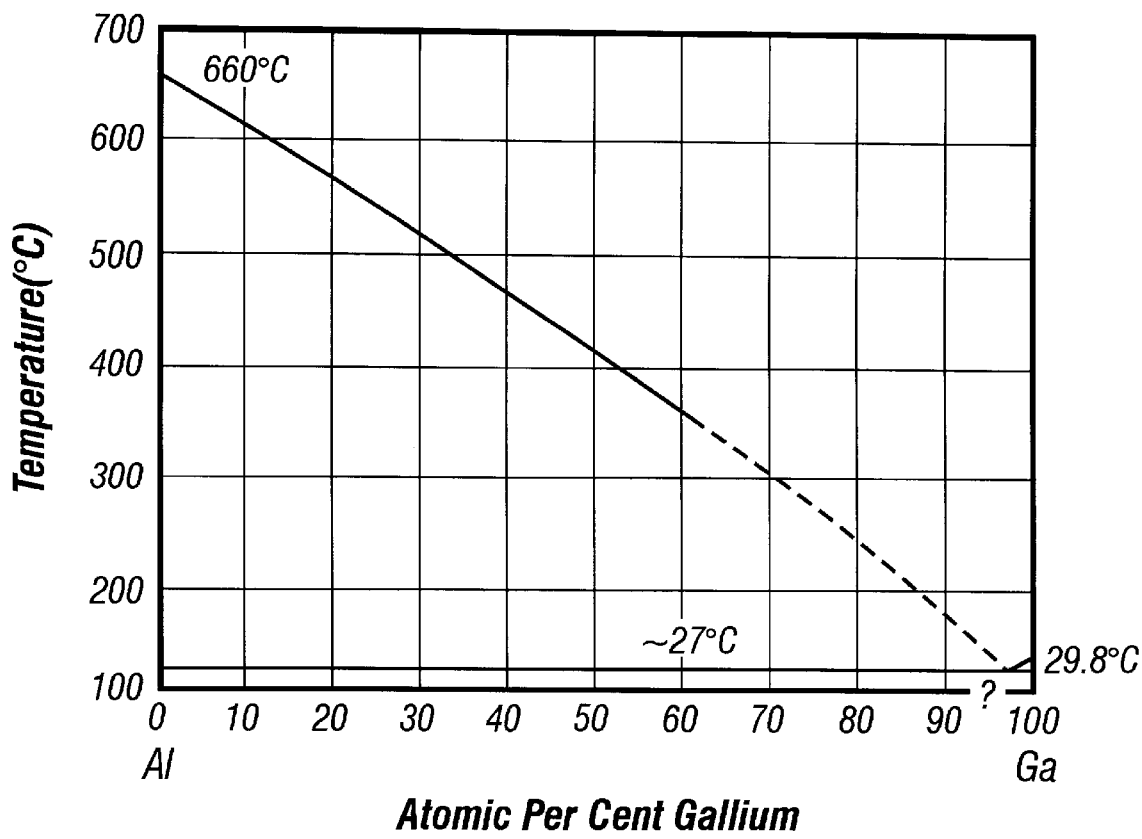
FIG. 6 is a phase chart of a binary alloy of aluminum and gallium.
Figure 7:
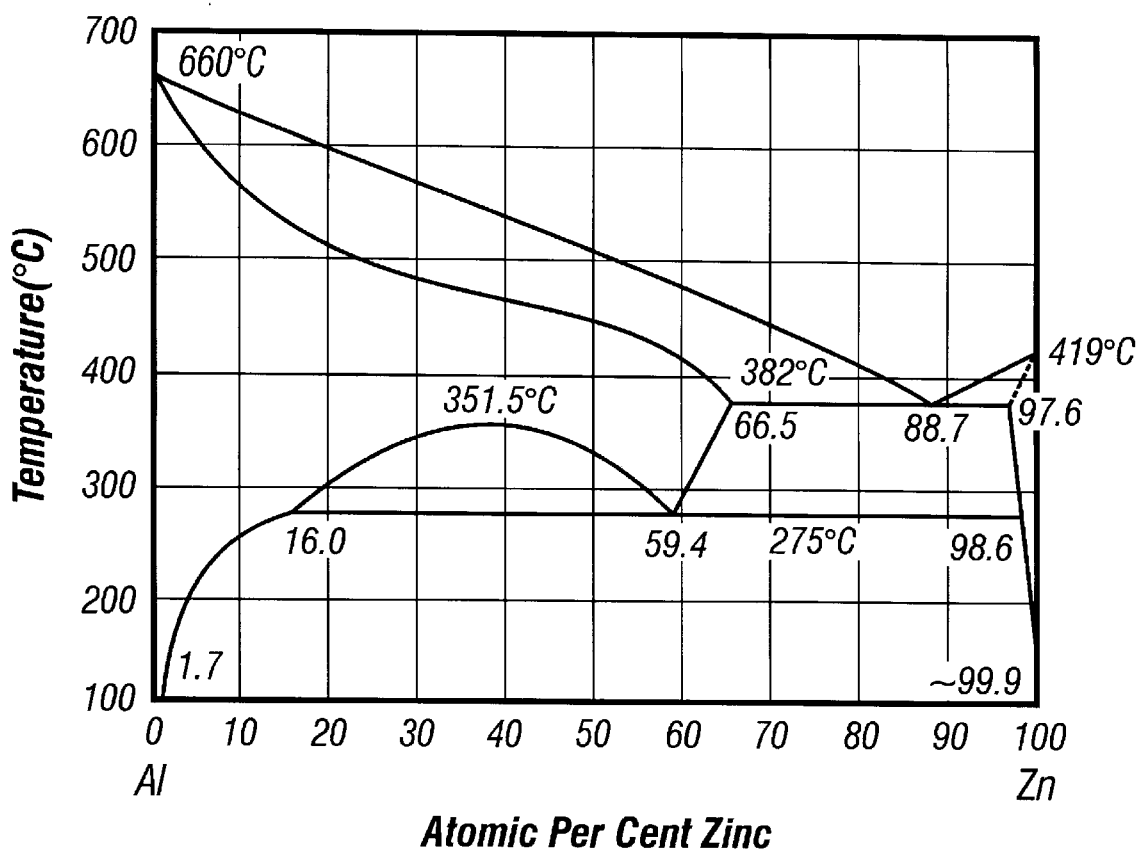
FIG. 7 is a phase chart of a binary alloy of aluminum and zinc.
Figure 8:
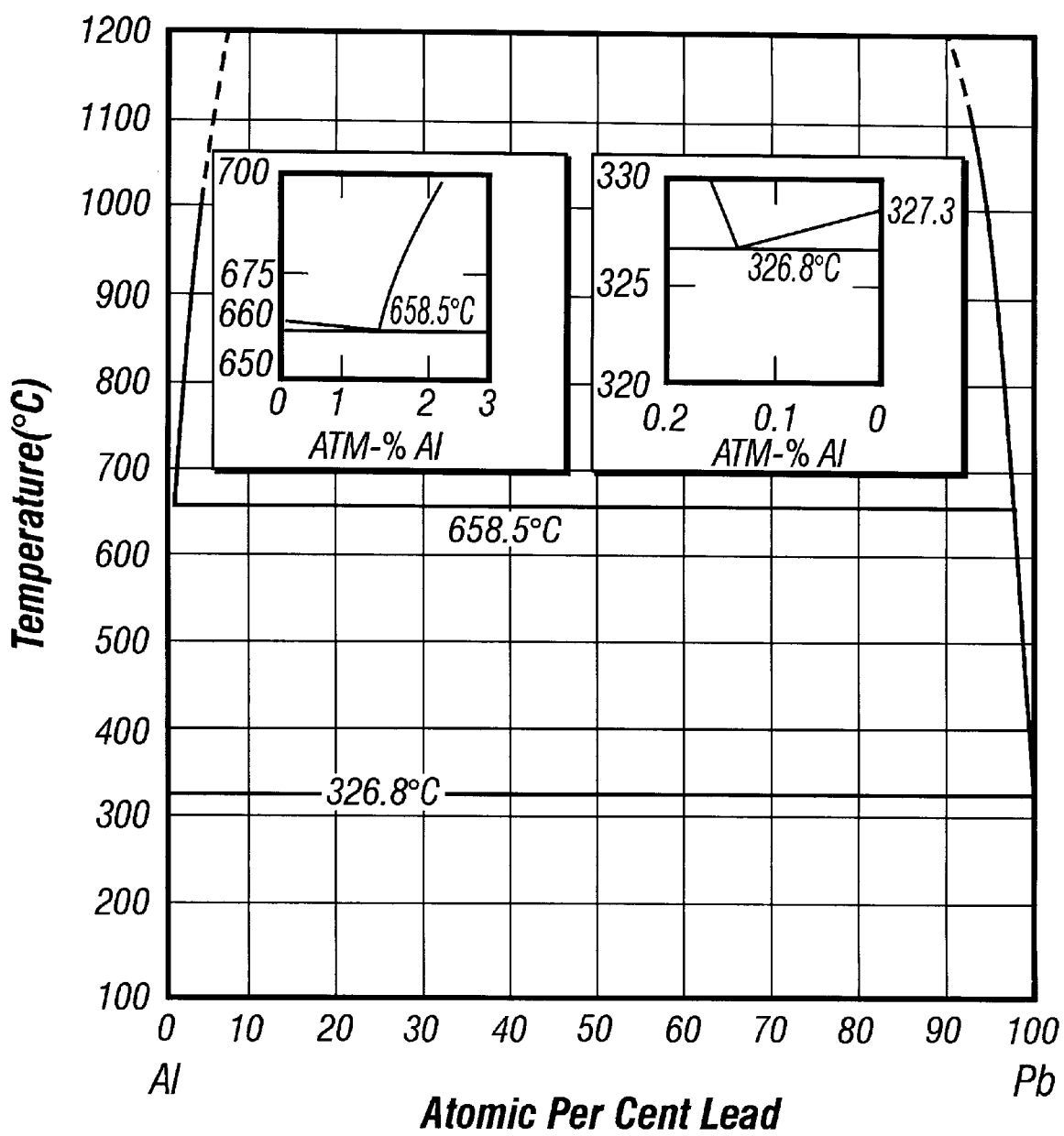
FIG. 8 is a phase chart of a binary alloy of aluminum and lead.

Although the minimum eutectic point of aluminum and germanium is 424° C. as shown in FIG. 4, the above-described rendering into flowable of germanium can be effected even at as low a temperature as 400° C. or so. However, from the viewpoint of reproducibility of its effects, it is preferred that the heating temperature of the reflow step be set at more than 375° C. In view of the heat resistance of aluminum, it is preferred that the upper limit of the heating temperature be set at less than 450° C.

After the reflow step, the metal thin film 315 and the alloy layer 320 are patterned into a source electrode 316 and a gate electrode 317.

It is noted that the reflow step may be performed after the source electrode 316 and the gate electrode 317 are formed by the patterning.

Next, a second interlayer insulating film 318 is formed. To this end, in this embodiment, first the source electrode 316 and the gate electrode 317 are covered with a silicon nitride film or a silicon oxynitride film (not shown), which is a buffer film for allowing a resin material to be formed thereon with good adhesiveness.

A resin film as a second interlayer insulating film 318 is laid thereon. The use of the resin film can reduce influences of a capacitance that is formed between the TFT and a transparent electrode to be formed later because the resin material can be so selected as to have a smaller relative permittivity than silicon oxide and silicon nitride.

Further, the use of the resin film as the second interlayer insulating film 318 allows a uniform electric field to be applied from the transparent electrode to a liquid crystal (not shown) because it imparts a high-degree of flatness to the surface of the TFT.

Figure 3C:
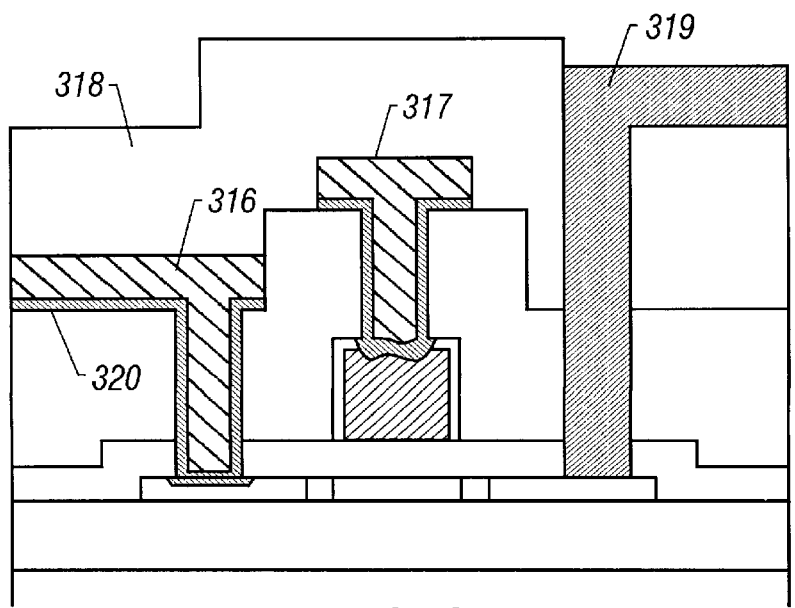

Finally, an ITO transparent electrode 319 is formed to complete the TFT as shown in FIG. 3C, which is disposed in the pixel region of an active matrix liquid crystal display device.

The TFT thus manufactured exhibits good contact performance irrespective of the shape of a contact hole, and is therefore free from such problems as a TFT operation failure due to disconnection of a wiring line or an electrode.

This embodiment can be applied not only to active matrix liquid crystal display devices but also EL display devices, EC display devices, and other thin-film integrated circuits.

EMBODIMENT 2

This embodiment is directed to a case of forming titanium films before and after the reflow step of the first embodiment. No additional drawings are provided for this embodiment because the manufacturing process of a TFT according to this embodiment is similar to that of the first embodiment.

A titanium film is formed before the reflow step in the following manner. In the state that the contact hole is formed as shown in FIG. 3A, a 500 Å thick titanium (Ti) film is formed (not shown). Being superior in asperity coverage, the titanium film can cover a side recess and blowholes to a certain extent.

Further, the titanium film has an effect of preventing a phenomenon that a silicide is formed by a reaction between aluminum that is a component of wiring lines to be formed later and silicon that is a component of the active layer. In addition, the titanium film has a feature that the contact angle with an aluminum film is small, which means superior wettability.

Therefore, a reliable contact can be attained by first obtaining good ohmic contact by the titanium film, then forming a wiring electrode, and finally performing the reflow step.

A titanium film is also formed after the reflow process in the following manner. In the state of FIG. 3B, a 500 Å thick titanium film (not shown) is formed on the metal thin film 315. This titanium film has an effect of improving ohmic contact between an output terminal and the wiring electrode at the time of causing current to flow out of the TFT.

EMBODIMENT 3

In the first embodiment, as shown in FIG. 3B, the metal thin film 315 to constitute the wiring electrodes is formed on the germanium film 300. This embodiment is directed to the opposite case where the germanium film 300 is formed on the metal thin film 315. This embodiment will be described with reference to FIG. 3A.

In the state of FIG. 3A, first a metal thin film 315 to become wiring electrodes is formed, and a germanium film 300 is formed thereon. The films 315 and 300 may be formed under the same conditions as in the first embodiment. Naturally a tin film, a gallium film, a zinc film, or the like may be used instead of the germanium film.

According to this embodiment, the surface of the metal thin film 315 mainly made of aluminum is not exposed to the air because it is covered with the germanium film 300. Therefore, no insulative film is formed on the surface of the metal thin film 315, which secures superior ohmic contact with a lead-out electrode which will be formed later.

Since the surface state and the surface shape of the metal thin film 315 significantly influence the progress of the reflow process, an insulative film formed on the metal thin film 315 is a factor of deteriorating the reflow of the metal thin film 315. This embodiment is effective in eliminating such an undesirable factor.

In practicing this embodiment, it is preferred that a titanium film as an undercoat film be also formed in the contact hole as in the second embodiment. This is to prevent a phenomenon that where a silicon film constitutes the bottom of the contact hole, a silicide is formed between the silicon film and the metal thin film 316 mainly made of aluminum.

It is also possible to combine this embodiment with the first embodiment to provide a sandwich structure of germanium film/metal thin film/germanium film. This allows the reflow process to be conducted more reliably.

EMBODIMENT 4

This embodiment is directed to a case of using sputtering to form the germanium film 300 in the first embodiment. In this embodiment, a germanium is formed on the surface of a target to be used in forming the metal thin film (aluminum film) 315.

If such a target is used, the germanium film 300 is formed first and the aluminum film 315 is formed subsequently.

In this embodiment, the thickness of the germanium film 300 and the degree of flowability in the reflow process can be controlled by controlling the thickness of the germanium film formed on the target.

EMBODIMENT 5

This embodiment is directed to cases where a film made of a metal element other than germanium is formed under the wiring electrode made of aluminum or a material mainly made of aluminum in the first or second embodiment. A manufacturing process of a TFT is not described here because it is similar to that of the first embodiment.

Examples of elements having equivalent effects to germanium which is used in the first and second embodiments include elements of groups 12 to 15 such as tin, gallium, zinc, lead, indium, and antimony.

In this embodiment, because of the use of a wiring electrode mainly made of aluminum, it is necessary that the reflow process can be effected at less than 450° C. For reference, FIGS. 4–10 are binary phase charts of aluminum and each of germanium, tin, gallium, zinc, lead, indium, and antimony, respectively.

Figure 9:
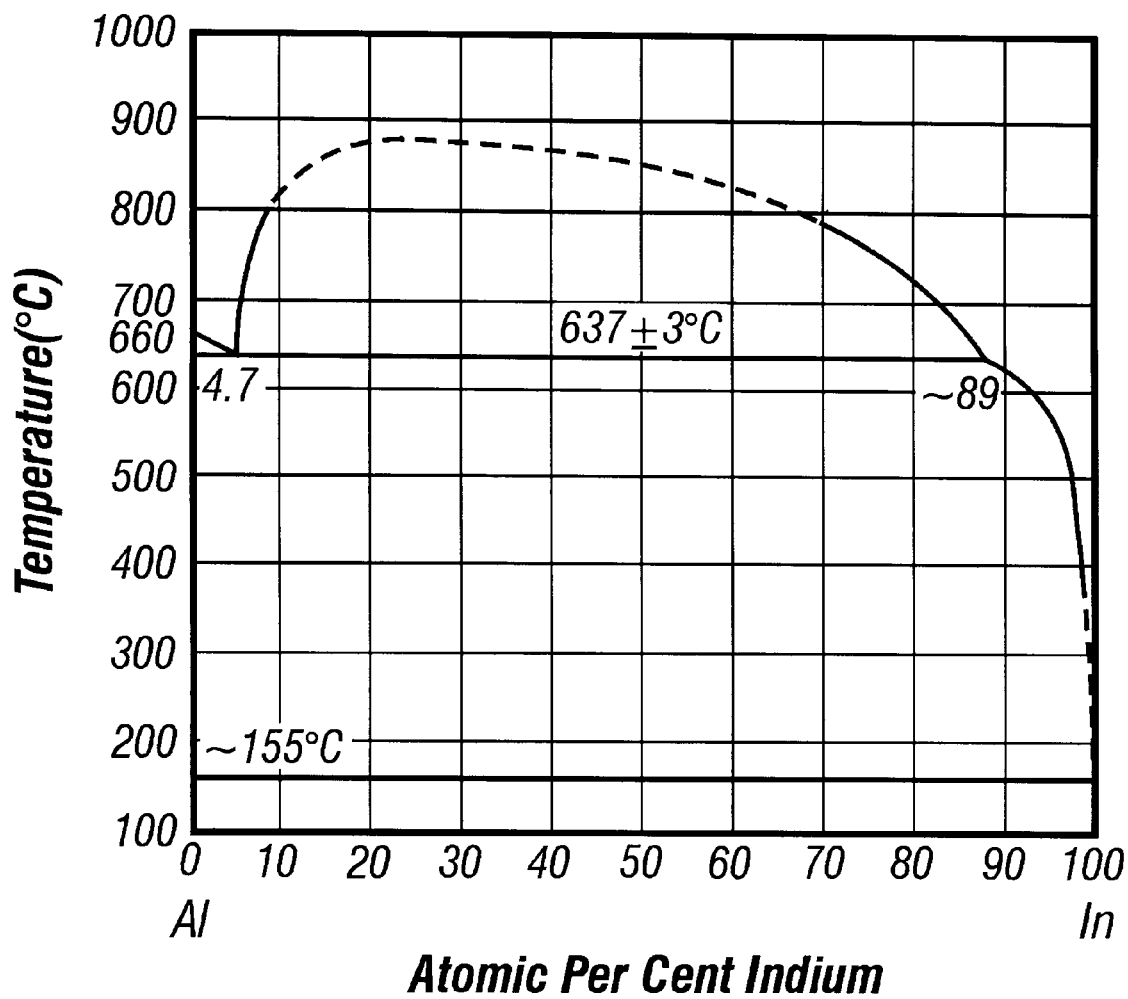
FIG. 9 is a phase chart of a binary alloy of aluminum and indium.
Figure 10:
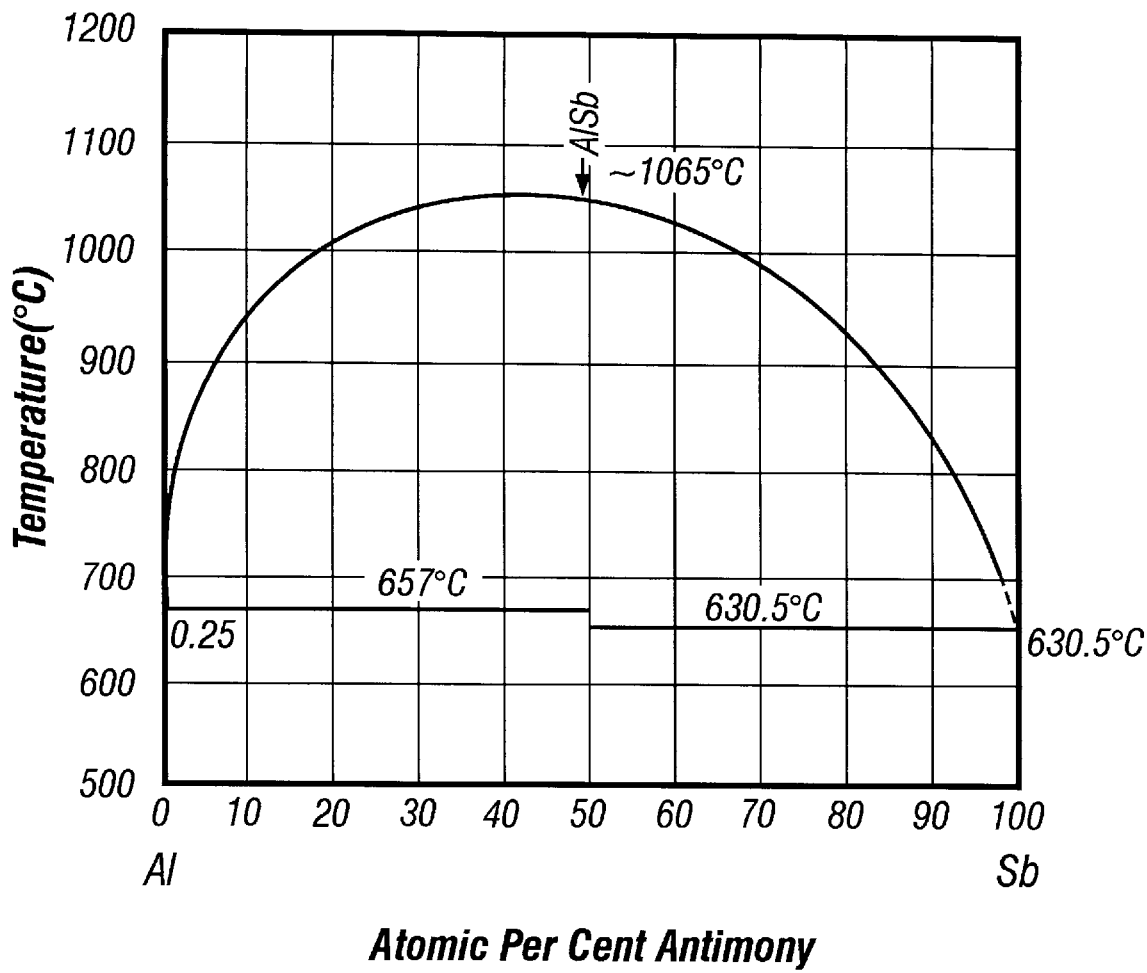
FIG. 10 is a phase chart of a binary alloy of aluminum and antimony.

It is understood from the phase charts that liquid phase states without any precipitation can be attained even at 450° C. if each element has a content that is in the following range (the rest corresponds to aluminum):

Ge: 25–32 atomic % (FIG. 4)
Sn: not less than 85 atomic % (FIG. 5)
Ga: not less than 45 atomic % (FIG. 6)
Zn: not less than 65 atomic % (FIG. 7)
Pb: not less than 99 atomic % (FIG. 8)
In: not less than 98 atomic % (FIG. 9)

Each of the above content values was obtained from a content of the element at which an eutectic point exists in the phase chart. Since flowability is obtained even at a temperature lower than the eutectic point in practice, the content range can be increased by plus and minus tens of percent, preferably ±15%, and even preferably ±25%.

Although an alloy of aluminum and antimony does not assume a liquid phase at 450° C. (see FIG. 10), it can somehow be used as a reflow material.

EMBODIMENT 6

This embodiment is directed to a case where RTA (rapid thermal annealing) is performed as a heat treatment in the reflow step. A manufacturing process of a TFT according to this embodiment is not described here because it is similar to that of the first embodiment.

The RTA is an annealing method in which an object to be processed is illuminated with strong infrared light, ultraviolet light, or the like that is emitted from a lamp. The RTA has a feature that substantially only a thin film at the very surface can be heated because of high rates of temperature increase and decrease and resulting short processing time of several seconds to several tens of seconds. For example, only a thin film formed on a glass substrate can be annealed at an extremely high temperature of about 1,000° C.

In the first embodiment, the reflow process is performed at less than 450° C. in view of the heat resistance of the aluminum gate electrode. However, the RTA technique of this embodiment allows heating to be performed at a temperature that is higher than the temperature determined from the heat resistance of a gate electrode, thereby increasing the allowable range of reflow temperature. As a result, the selection range of metal elements to be used for the reflow step can also be increased.

Further, since the RTA is performed in a very short time of several seconds to several tens of seconds, it is very advantageous in terms of productivity.

EMBODIMENT 7

This embodiment is directed to a case of adding, by using sputtering, a germanium to a wiring electrode mainly made of aluminum. A manufacturing process of a TFT according to this embodiment is not described here because it is similar to that of the first embodiment.

To enable a reflow process to be performed at less than 450° C., preferably less than 400° C., it is desirable that the germanium content be 20–40 atomic %, which was obtained from a germanium content (30 atomic %) at which the eutectic point exists. Since flowability is obtained even at a temperature lower than the eutectic point in practice, the range of 20–40 atomic % would be proper.

Once a contact hole is formed through the interlayer insulating film, a wiring electrode mainly made of aluminum and containing germanium at 20–40 atomic % is directly formed thereon. In this embodiment, sputtering is performed by placing germanium particles on an aluminum target containing copper at 2%. Naturally the sputtering may be performed according to the method of the fourth embodiment.

In this manner, a wiring electrode can easily be formed which enables a reliable reflow process.

In this embodiment, although the germanium content in the wiring electrode is relatively high immediately after the start of its formation, the it gradually decreases as the sputtering proceeds. However, this causes no problem because it suffices that the reflow occur at least in a surface layer that is in contact with a side recess or blowholes.

Apparently the sputtering may be performed by using an existing target made of an aluminum/germanium alloy or having a multilayered structure. Further, the wiring line may have a multilayered structure consisting of layers containing and not containing germanium, respectively.

Since the thus-formed metal thin film is easily rendered flowable by a reflow process of 375° C.–450° C. and one hour, a side recess and blowholes in the contact hole can be covered reliably to thereby leaving no disconnections, that is, a reliable contact can be formed.

EMBODIMENT 8

This embodiment is directed to a case of using thermal CVD to form a germanium film 300 or a metal thin film 315 containing germanium in the state of FIG. 3A. A manufacturing process of a TFT according to this embodiment is not described here because it is similar to that of the first embodiment.

First, once a contact hole is formed, a metal thin film 315 mainly made of aluminum and containing germanium at 20–40 atomic % is directly formed. In this embodiment, DMAH (dimethyl aluminum hydride; alkyl metal) and GeH$_4$ are used as film forming gases.

If only GeH$_4$ is used as a film forming gas, only a germanium film can be formed as a film 300.

In this embodiment, the film forming temperature is set at 250° C.–270° C., in which case the film forming rate is 4500 Å/min. The resistivity amounts to 2.95 $\mu\Omega$cm, which is close to a bulk resistivity value.

Since the thus-formed metal thin film 315 is easily rendered flowable by a reflow process, a side recess and blowholes in the contact hole can be covered reliably to thereby leave no disconnections, that is, a reliable contact can be formed.

EMBODIMENT 9

Although in the first embodiment the germanium film 300 is formed by plasma CVD, it may be formed by sputtering. In this embodiment, an apparatus having a multi-chamber (cluster tool) structure as shown in FIG. 12 is used as a sputtering apparatus.

Figure 12:
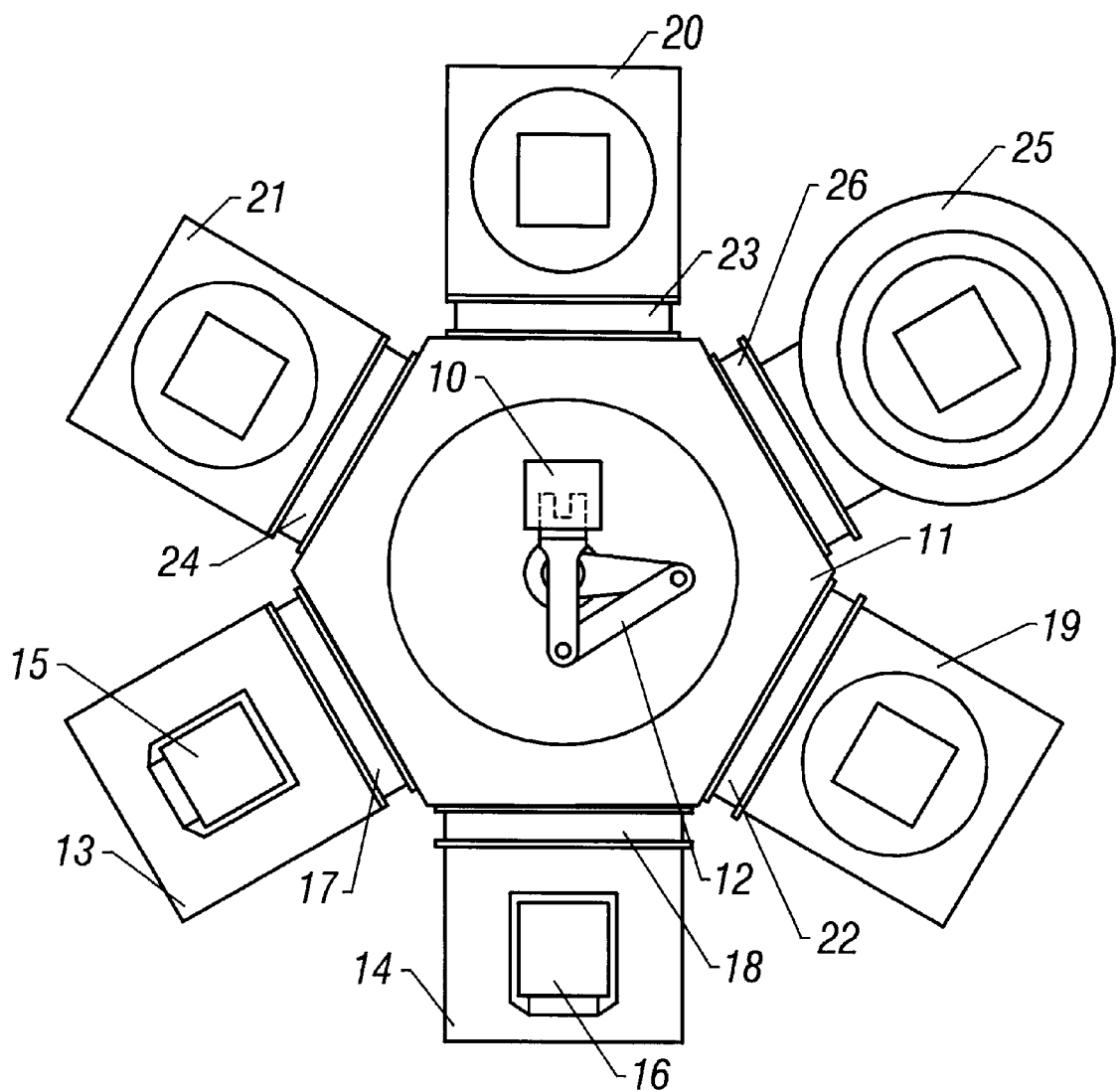
FIG. 12 shows the configuration of a sputtering apparatus used in a ninth embodiment of the invention.

The sputtering apparatus of FIG. 12 enables thin films of different compositions to be laid one on another consecutively by providing targets of different compositions (including a case of using different elements) in respective reaction chambers.

The configuration of the sputtering apparatus of FIG. 12 will now be described briefly. Reference numeral 10 denotes a substrate to be processed; 11, a common chamber as the apparatus main body; and 12, a transfer mechanism for transferring the substrate 10. The substrate 10 is input to and output from the common chamber 11 through load lock chambers 13 and 14 that are connected to the common chamber 11. Reference numerals 15 and 16 denote substrate transfer cassettes provided in the respective load lock chambers 13 and 14. Gate valves 17 and 18 serve to isolate the respective load lock chambers 13 and 14 from the common chamber 11 in an airtight manner.

Further, first to third reaction chambers 19–21 are connected to the common chamber 11. Gate valves 22–24 serve to isolate the respective reaction chambers 19–21 from the common chamber 11 in an airtight manner. For example, heating chamber 25 is used for preheating which is preprocessing of formation of a thin film on the substrate 10. A gate valve 26 serves to isolate the heating chamber 25 from the common chamber 11 in an airtight manner.

A description will now be made of an example in which a multilayered structure consisting of thin films of different compositions is formed by using the above sputtering apparatus.

For example, an aluminum (Al) target is provided in the first reaction chamber 19, a germanium (Ge) target is provided in the second reaction chamber 20, and a tin (Sn) target is provided in the third reaction chamber 21. In this case, by consecutively performing the film forming operations by using the respective targets, a desired multilayered structure such as a Ge—Al—Sn or Al—Ge—Sn multilayered structure can be obtained without opening to the air.

In the reflow step, the surface shape and the surface state of a metal thin film to be subjected to the reflow process are important factors which greatly influence the reflow process. For example, in an air atmosphere, a natural oxide film is immediately formed on the surface of a thin film mainly made of aluminum. The natural oxide film is a factor of impairing the reflow operation. Further, since the natural oxide film is insulative, it also impairs formation of an ohmic contact with another conductive thin film.

However, this embodiment is free from the above problems because metal thin films of different compositions can be laid one on another without exposing the substrate 10 to the air. The advantage of this embodiment that multilayering can be effected without opening to the air is particularly remarkable in forming a multilayered structure including an aluminum thin film, because an aluminum surface is easily oxidized.

EMBODIMENT 10

In the fourth embodiment, a germanium film is formed by sputtering. However, the fourth embodiment has a problem that once a film forming operation is performed, there remains no germanium film on the surface of the target used. To enable consecutive film forming operations, it is necessary to prepare a target exclusively used, for instance, a target in which a set of an aluminum film and a germanium film whose amounts are larger than the minimum amounts necessary for a single film forming operation of the fourth embodiment is laid one on another. Further, such a target needs to be replaced when used out. This is problematic in terms of throughput and cost.

One of measures for solving the above problem is to provide the sputtering apparatus with a function of "forming a germanium film on a target." In this measure, a film forming operation is repeated according to the following steps:

(1) Forming a Ge—Al multilayer film by using a first target.

(2) After completion of step (1), the subject substrate is switched to the next one and the first target is replaced by a second target.

(3) While a Ge—Al multilayer film is formed by using the second target, a germanium film is formed on the first target in another reaction chamber.

By repeating the above steps, there can be obtained an aluminum target on which a germanium film is always deposited. The multi-chamber structure of FIG. 12 can be used in this embodiment. Further, a sputtering apparatus used in this embodiment may be equipped with a transfer mechanism for target switching and a device for forming a germanium film on a target.

EMBODIMENT 11

In this embodiment, it will be explained based on experimental results that the reflow step of this invention is very effective in eliminating a wiring line disconnection failure within a contact hole. This embodiment also refers to a case where hydrogen is used as a processing atmosphere of the reflow step. SEM photographs of FIGS. 14A–14C will be used in the following description.

FIGS. 14A–14C show cross-sections of contact holes. The inside diameter of the contact hole is about 2 μm and the thickness of an interlayer insulating film is about 0.8 μm. A wiring line structure to fill in the contact hole is composed of a 500 Å thick Ti film, a 10,000 Å thick Al—Si film, and a 50 Å thick Sn film from the bottom.

The wiring line was made much thicker than in ordinary cases to form samples which would show the reflow effects more remarkably. The wiring line having the 3-layer structure was formed consecutively by using the multi-chamber sputtering apparatus of FIG. 12.

After the formation of the above wiring line structure, the substrate was subjected to the reflow process (conditions are shown below). Contact hole cross-sections were SEM-observed in each of the following states:

(1) Initial state before being subjected to the reflow process.

(2) State after being subjected to the reflow process of 450° C. and one hour in a nitrogen atmosphere.

(3) State after being subjected to the reflow process of 450° C. and one hour in a 3%-hydrogen atmosphere.

FIG. 14A shows a contact hole cross-section in the initial state, i.e., before the substrate's being subjected to the reflow process. In this state, a wiring line disconnection failure is found at a bottom portion of the contact hole (close to the contact hole side wall). The reflow process of the invention is intended to eliminate such a disconnection failure.

FIG. 14B shows a contact hole cross-section after the substrate's being subjected to the reflow process of 450° C. and one hour in a nitrogen atmosphere. As seen from FIG. 14B, the outline of the wiring line is made gentler as a whole by the reflow effect. The disconnected portion in the initial state is now repaired due to a reflow of the wiring material.

FIG. 14C shows a contact hole cross-section after the substrate's being subjected to the reflow process of 450° C. and one hour in a 3%-hydrogen atmosphere (diluted by nitrogen). As seen from FIG. 14C, the outline of the wiring line is made even gentler as a whole and the contact state of the wiring material within the contact hole is made very good.

It is understood from the comparison between FIGS. 14A–14C that the reflow process of the invention is clearly effective in eliminating a wiring line disconnection failure within a contact hole.

In particular, it is understood that a more reliable contact shape can be obtained by using hydrogen as a processing atmosphere of the reflow process, which accelerates rendering the wiring material flowable. Although the reason for this acceleration is not entirely clear, the inventors consider that it is due to that a natural oxide film on a wiring line surface is removed by the reducing effect of hydrogen to such an extent that rendering flowable of a wiring material is not hindered.

As described above, according to the invention, by conducting a reflow process using such an element as germanium or tin in forming a contact to a wiring electrode that is mainly made of aluminum, a reliable contact can be formed by virtue of the action of the above element.

As a result, a superior contact can be obtained even in a case where a side recess or blowholes are formed in a contact hole, whereby the reliability of a TFT is greatly improved.

What is claimed is:

1. A method of manufacturing a semiconductor device, comprising the steps of:

forming a thin-film transistor on an insulating surface, said thin-film transistor comprising at least a semiconductor layer, a gate electrode, and a gate insulating film interposed therebetween;

forming an insulating film on said thin-film transistor;

forming a contact hole through the insulating film, to expose said gate electrode in a bottom portion of the contact hole;

forming, at least in the bottom portion of the contact hole, a first film comprising a material selected from the group consisting of germanium, tin, zinc, lead, indium, gallium and antimony;

forming a second conductive layer to constitute a wiring line on the first film; and performing a heat treatment to flow said first film and at least a part of said second conductive layer to form an alloy therebetween.

2. The method of claim 1 wherein the heat treatment comprises a rapid thermal annealing.

3. The method of claim 1, wherein the second conductive layer comprises only or mainly aluminum.

4. The method of claim 1 wherein said semiconductor device is an EL display device or an active matrix liquid crystal display device.

5. The method of claim 1 wherein a thickness of said semiconductor layer is 500 Å.

6. A method of manufacturing a semiconductor device, comprising the steps of:

forming a thin-film transistor on an insulating surface, said thin-film transistor comprising at least a semiconductor layer, a gate electrode, and a gate insulating film interposed therebetween;

forming an insulating film on said thin-film transistor;

forming a contact hole through the insulating film, to expose the semiconductor layer in a bottom portion of the contact hole;

forming, at least in the bottom portion of the contact hole, a first film comprising a material selected from the group consisting of germanium, tin, zinc, lead, indium, gallium and antimony;

forming a second conductive layer to constitute a wiring line on the first film; and performing a heat treatment to flow said first film and at least a part of said second conductive layer to form an alloy therebetween.

7. The method of claim 6 wherein the heat treatment comprises a rapid thermal annealing.

8. The method of claim 6 wherein said second conductive layer comprises only or mainly aluminum.

9. The method of claim 6 wherein said semiconductor device is an EL display device or an active matrix liquid crystal display device.

10. The method of claim 6 wherein a thickness of said semiconductor layer is 500 Å.

11. A method of manufacturing a semiconductor device, comprising the steps of:
   forming a thin-film transistor on an insulating surface, said thin-film transistor comprising at least a semiconductor layer, a gate electrode, and a gate insulating film interposed therebetween;
   forming an insulating film on said thin-film transistor;
   forming a contact hole in said insulating film to expose a portion of said gate electrode or said semiconductor layer;
   forming a first conductive film comprising aluminum on said insulating film and said contact hole;
   forming a second film having a melting point lower than said first conductive film on said first conductive film and over said contact hole;
   forming a third conductive film comprising aluminum on said second film and over said contact hole; and
   heating said first, second and third films to flow at least said second film.

12. The method of claim 11 wherein the heat treatment comprises a rapid thermal annealing.

13. The method of claim 11 wherein said second film comprises a material selected from the group consisting of germanium, tin, gallium, zinc, indium and antimony.

14. The method of claim 11 wherein said semiconductor device is an EL display device or an active matrix liquid crystal display device.

15. The method of claim 11 wherein a thickness of said semiconductor layer is 500 Å.

16. A method of manufacturing a semiconductor device, comprising the steps of:
   forming a thin-film transistor on an insulating surface, said thin-film transistor comprising at least a semiconductor layer, a gate electrode, and a gate insulating film interposed therebetween;
   forming an insulating film over said thin-film transistor;
   forming a contact hole through at least said insulating film to expose a portion of said gate electrode;
   forming a first film on at least said contact hole;
   forming a first conductive layer over said insulating film and said contact hole so that said first conductive layer is formed on the first film, wherein said first conductive layer has a higher melting point than said first film;
   performing a heat treatment to flow at least the first film, thereby making an electrical connection between the first conductive layer and the gate electrode.

17. The method of claim 16 wherein said gate electrode is located over said semiconductor layer.

18. The method of claim 16 wherein said semiconductor device is an EL display device or an active matrix liquid crystal display device.

19. The method of claim 16 wherein said first film is one or a plurality of elements selected from the group consisting of germanium, tin, gallium, zinc, indium and antimony.

20. The method of claim 16 wherein said first conductive layer comprises aluminum.

21. The method of claim 16 wherein said insulating film comprises a material selected from the group consisting of silicon oxide, silicon nitride, and silicon oxynitride.

22. The method of claim 16 wherein a thickness of said semiconductor layer is 500 Å.

23. A method of manufacturing a semiconductor device, comprising the steps of:
   forming a thin-film transistor on an insulating surface, said thin-film transistor comprising at least a semiconductor layer, a gate electrode, and a gate insulating film interposed therebetween;
   forming an insulating film over said thin-film transistor;
   forming a contact hole through at least said insulating film to expose a portion of said semiconductor layer;
   forming a first film on at least said contact hole;
   forming a first conductive layer over said insulating film, and said contact hole so that said first conductive layer is formed on the first film, wherein said first conductive layer has a higher melting point than said first film;
   performing a heat treatment to flow at least the first film, thereby making an electrical connection between the first conductive layer and said portion of the semiconductor layer.

24. The method of claim 23 wherein said gate electrode is located over said semiconductor layer.

25. The method of claim 23 wherein said semiconductor device is an EL display device or an active matrix liquid crystal display device.

26. The method of claim 23 wherein said first film is one or a plurality of elements selected from the group consisting of germanium, tin, gallium, zinc, indium and antimony.

27. The method of claim 23 wherein said first conductive layer comprises aluminum.

28. The method of claim 23 wherein said insulating film comprises a material selected from the group consisting of silicon oxide, silicon nitride, and silicon oxynitride.

29. The method of claim 23 wherein a thickness of said semiconductor layer is 500 Å.

30. A method of manufacturing a semiconductor device, comprising the steps of:
   forming a thin-film transistor on an insulating surface, said thin-film transistor comprising at least a semiconductor layer, a gate electrode, and a gate insulating film interposed therebetween;
   forming a first insulating film over said thin-film transistor;
   forming a contact hole through at least said first insulating film to expose a portion of said gate electrode;
   forming a first film on at least said contact hole;
   forming a first conductive layer over said first insulating film, and said contact hole so that said first conductive layer is formed on said first film;
   performing a heat treatment to flow at least the first film, thereby making an electrical connection between the first conductive layer and the gate electrodes;
   forming a second insulating film comprising a material selected from the group consisting of silicon nitride and silicon oxynitride formed over said first insulating film.

31. The method of claim 30 wherein said gate electrode is located over said semiconductor layer.

32. The method of claim 30 wherein said semiconductor device is an EL display device or an active matrix liquid crystal display device.

33. The method of claim 30 wherein said first film is one or a plurality of elements selected from the group consisting of germanium, tin, gallium, zinc, indium and antimony.

34. The method of claim 30 wherein said first conductive layer comprises aluminum.

35. The method of claim 30 wherein said first insulating film comprises a material selected from the group consisting of silicon oxide, silicon nitride, and silicon oxynitride.

36. The method of claim 30 wherein a thickness of said semiconductor layer is 500 Å.

37. A method of manufacturing a semiconductor device, comprising the steps of:
- forming a thin-film transistor on an insulating surface, said thin-film transistor comprising at least a semiconductor layer, a gate electrode, and a gate insulating film interposed therebetween;
- forming a first insulating film over said thin-film transistor;
- forming a contact hole through at least said first insulating film to expose a portion of said semiconductor layer;
- forming a first film on at least said contact hole;
- forming a first conductive layer over said first insulating film, and said contact hole so that said first conductive layer is formed on said first film;
- performing a heat treatment to flow at least the first film, thereby making an electrical connection between the first conductive layer and said portion of the semiconductor layer;
- forming a second insulating film comprising a material selected from the group consisting of silicon nitride and silicon oxynitride formed over said first insulating film.

38. The method of claim 37 wherein said gate electrode is located over said semiconductor layer.

39. The method of claim 37 wherein said semiconductor device is an EL display device or an active matrix liquid crystal display device.

40. The method of claim 31 wherein said first film is one or a plurality of elements selected from the group consisting of germanium, tin, gallium, zinc, indium and antimony.

41. The method of claim 37 wherein said first conductive layer comprises aluminum.

42. The method of claim 37 wherein said first insulating film comprises a material selected from the group consisting of silicon oxide, silicon nitride, and silicon oxynitride.

43. The method of claim 37 wherein a thickness of said semiconductor layer is 500 Å.

44. A method of manufacturing a semiconductor device, comprising the steps of:
- forming a thin-film transistor on an insulating surface, said thin-film transistor comprising at least a semiconductor layer, a gate electrode, and a gate insulating film interposed therebetween;
- forming an insulating film over said thin-film transistor;
- forming a contact hole through at least said insulating film to expose a portion of said gate electrode;
- forming a first conductive layer on at least said contact hole and said insulating film;
- forming a first film on said first conductive layer and over said contact hole, wherein said first conductive layer has a higher melting point than said first film;
- performing a heat treatment to flow at least the first film, thereby making an electrical connection between the first conductive layer and the gate electrode.

45. The method of claim 44 wherein said gate electrode is located over said semiconductor layer.

46. The method of claim 44 wherein said semiconductor device is an EL display device or an active matrix liquid crystal display device.

47. The method of claim 44 wherein said first film is one or a plurality of elements selected from the group consisting of germanium, tin, gallium, zinc, indium and antimony.

48. The method of claim 44 wherein said first conductive layer comprises aluminum.

49. The method of claim 44 wherein said insulating film comprises a material selected from the group consisting of silicon oxide, silicon nitride, and silicon oxynitride.

50. The method of claim 44 wherein a thickness of said semiconductor layer is 500 Å.

51. A method of manufacturing a semiconductor device, comprising the steps of:
- forming a thin-film transistor on an insulating surface, said thin-film transistor comprising at least a semiconductor layer, a gate electrode, and a gate insulating film interposed therebetween;
- forming an insulating film over said thin-film transistor;
- forming a contact hole through at least said insulating film to expose a portion of said semiconductor layer;
- forming a first conductive layer on at least said contact hole and said insulating film;
- forming a first film on said first conductive layer and over said contact hole, wherein said first conductive layer has a higher melting point than said first film;
- performing a heat treatment to flow at least the first film, thereby making an electrical connection between the first conductive layer and said portion of the semiconductor layer.

52. The method of claim 51 wherein said gate electrode is located over said semiconductor layer.

53. The method of claim 51 wherein said semiconductor device is an EL display device or an active matrix liquid crystal display device.

54. The method of claim 51 wherein said first film is one or a plurality of elements selected from the group consisting of germanium, tin, gallium, zinc, indium and antimony.

55. The method of claim 51 wherein said first conductive layer comprises aluminum.

56. The method of claim 51 wherein said insulating film comprises a material selected from the group consisting of silicon oxide, silicon nitride, and silicon oxynitride.

57. The method of claim 51 wherein a thickness of said semiconductor layer is 500 Å.

58. A method of manufacturing a semiconductor device, comprising the steps of:
- forming a thin-film transistor on an insulating surface, said thin-film transistor comprising at least a semiconductor layer, a gate electrode, and a gate insulating film interposed therebetween;
- forming a first insulating film over said thin-film transistor;
- forming a contact hole through at least said first insulating film to expose a portion of said gate electrode;
- forming a first conductive layer on at least said contact hole and said first insulating film;
- forming a first film on said first conductive layer and over said contact hole, wherein said first conductive layer has a higher melting point than said first film;
- performing a heat treatment to flow at least the first film, thereby making an electrical connection between the first conductive layer and the gate electrodes;
- forming a second insulating film comprising a material selected from the group consisting of silicon nitride and silicon oxynitride formed over said first insulating film.

59. The method of claim 58 wherein said gate electrode is located over said semiconductor layer.

60. The method of claim 58 wherein said semiconductor device is an EL display device or an active matrix liquid crystal display device.

61. The method of claim 58 wherein said first film is one or a plurality of elements selected from the group consisting of germanium, tin, gallium, zinc, indium and antimony.

62. The method of claim 58 wherein said first conductive layer comprises aluminum.

63. The method of claim 58 wherein said first insulating film comprises a material selected from the group consisting of silicon oxide, silicon nitride, and silicon oxynitride.

64. The method of claim 58 wherein a thickness of said semiconductor layer is 500 Å.

65. A method of manufacturing a semiconductor device, comprising the steps of:

forming a thin-film transistor on an insulating surface, said thin-film transistor comprising at least a semiconductor layer, a gate electrode, and a gate insulating film interposed therebetween;

forming a first insulating film over said thin-film transistor;

forming a contact hole through at least said first insulating film to expose a portion of said semiconductor layer;

forming a first conductive layer on at least said contact hole and said first insulating film;

forming a first film on said first conductive layer and over said contact hole, wherein said first conductive layer has a higher melting point than said first film;

performing a heat treatment to flow at least the first film, thereby making an electrical connection between the first conductive layer and said portion of the semiconductor layer;

forming a second insulating film comprising a material selected from the group consisting of silicon nitride and silicon oxynitride formed over said first insulating film.

66. The method of claim 65 wherein said gate electrode is located over said semiconductor layer.

67. The method of claim 65 wherein said semiconductor device is an EL display device or an active matrix liquid crystal display device.

68. The method of claim 65 wherein said first film is one or a plurality of elements selected from the group consisting of germanium, tin, gallium, zinc, indium and antimony.

69. The method of claim 65 wherein said first conductive layer comprises aluminum.

70. The method of claim 65 wherein said first insulating film comprises a material selected from the group consisting of silicon oxide, silicon nitride, and silicon oxynitride.

71. The method of claim 65 wherein a thickness of said semiconductor layer is 500 Å.

* * * * *